United States Patent
Hamamoto et al.

(10) Patent No.: US 6,603,817 B1
(45) Date of Patent: Aug. 5, 2003

(54) BUFFER CIRCUIT CAPABLE OF CORRECTLY TRANSFERRING SMALL AMPLITUDE SIGNAL IN SYNCHRONIZATION WITH HIGH SPEED CLOCK SIGNAL

(75) Inventors: Takeshi Hamamoto, Hyogo (JP); Zenya Kawaguchi, Hyogo (JP)

(73) Assignee: Mitsubisihi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/531,504

(22) Filed: Mar. 21, 2000

(51) Int. Cl.⁷ .............................. H03H 7/30; H04B 3/00
(52) U.S. Cl. ...................... 375/257; 375/372; 375/295; 375/229
(58) Field of Search ................................ 375/229, 230, 375/231, 372, 257, 295, 222, 219; 708/323; 365/189.04, 189.05, 189.09, 190, 202, 203, 230.03, 230.06, 230.08, 233, 185.08, 185.23; 326/20, 83, 86, 87, 89, 90; 330/278, 263, 264, 254, 255, 269, 250, 304, 277, 310, 307; 333/28 R, 18; 711/101, 118, 105, 113, 115, 121, 130–132, 144, 145, 147, 154, 155

(56) References Cited

U.S. PATENT DOCUMENTS

| | | | | |
|---|---|---|---|---|
| 5,153,459 A | * | 10/1992 | Park et al. ...................... | 326/86 |
| 5,325,328 A | * | 6/1994 | Muroya et al. ........ | 365/189.05 |
| 5,369,611 A | * | 11/1994 | Miura .................... | 365/189.05 |
| 5,576,641 A | * | 11/1996 | Yoneya et al. ................. | 326/83 |
| 6,026,034 A | * | 2/2000 | Suzuki et al. ................ | 365/190 |
| 6,040,715 A | * | 3/2000 | Kang et al. .................... | 326/87 |
| 6,353,569 B1 | * | 3/2002 | Mizuno et al. ............. | 365/210 |

FOREIGN PATENT DOCUMENTS

| | | |
|---|---|---|
| JP | 5-28752 | 2/1993 |
| JP | 5-28766 | 2/1993 |

* cited by examiner

*Primary Examiner*—Tesfaldet Bocure
*Assistant Examiner*—Khanh Cong Tran
(74) *Attorney, Agent, or Firm*—McDermott, Will & Emery

(57) ABSTRACT

Complementary signals on a pair of first signal lines are transferred onto a pair of second signal lines in synchronization with a clock signal by a buffer circuit. The buffer circuit includes an equalize circuit to equalize a pair of internal nodes to a prescribed potential, a transfer gate circuit activated, when the equalize circuit completes equalization, to couple the pair of first signal lines and the pair of internal nodes, an amplifier circuit to differentially amplify the signals on the internal nodes when the transfer gate completes the transfer operation, an output transfer circuit to transmit the signals on the pair of internal nodes onto the pair of second signal lines in synchronization with the clock signal, and a control circuit to control the operation of the equalize circuit, the transfer gate circuit and the amplifier circuit. After the pair of internal nodes is equalized to the prescribed potential, the signals from the pair of first signal lines are received and amplified. Even if the signals are small amplitude signals, therefore, they can be correctly amplified and transferred in synchronization with the clock signal without destroying the signal amplitude.

20 Claims, 19 Drawing Sheets

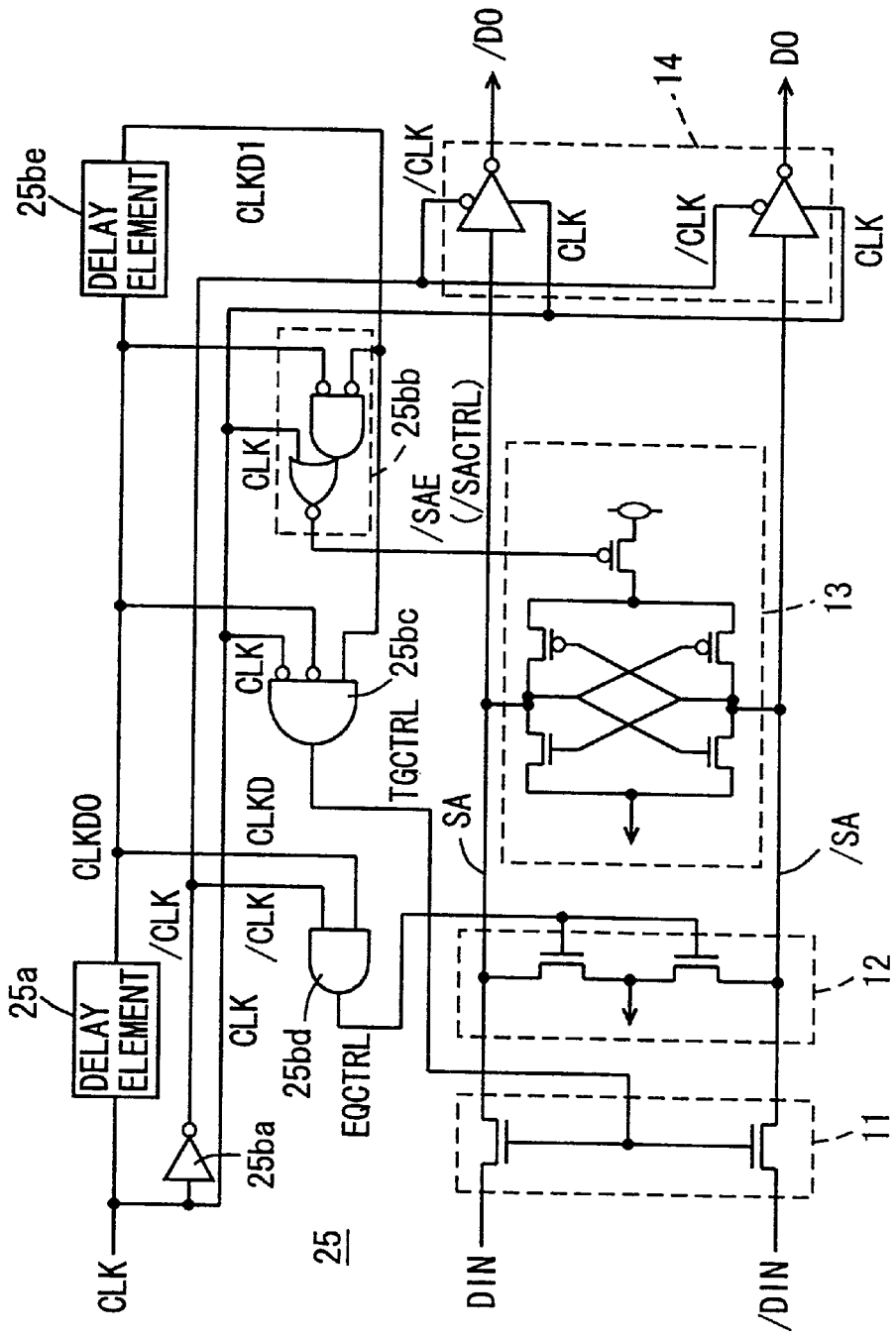
F I G. 3 1

BUFFER CIRCUIT CAPABLE OF CORRECTLY TRANSFERRING SMALL AMPLITUDE SIGNAL IN SYNCHRONIZATION WITH HIGH SPEED CLOCK SIGNAL

BACKGROUND OF THE INVENTION

1. Field of the Invention

The present invention relates to buffer circuits, and particularly to a buffer circuit which transfers small amplitude signals in synchronization with a clock signal. More particularly, the present invention relates to a read data transferring buffer circuit for transferring internal read data in synchronization with a clock signal in a semiconductor memory device.

2. Description of the Background Art

In order to improve data transfer efficiency, the bit width of data to be dealt in a semiconductor device has been frequently made larger in recent years. Such internal data with a lager bit width are transferred in parallel on an internal data bus with a larger bit width. In a semiconductor device which operates in synchronization with a clock signal, internal data are transferred by using buffer circuits operating in synchronization with the clock signal. Since the buffer circuits provided for bus lines of the internal data bus operate in parallel, the larger bit width of the internal data results in increase in number of the buffer circuits operating in parallel, and increase in power consumption when the internal data are transferred.

The power consumption is reduced by forming the internal data bus into a pair of complementary data lines and transmitting one-bit data in the form of a pair of complementary signals. Because of pair of the complementary signals of data on the internal data line pair can be dealt as small amplitude signals which in turn have their amplitudes smaller than a power supply potential. Thus, the need to fully swing the internal data bus lines between power supply and ground voltages is eliminated, and the power consumption is reduced. When such data in the form of small amplitude signals is to be transferred, the buffer circuit amplifies the small amplitude signals.

FIG. 1 shows one example of the arrangement of a buffer circuit transferring a small amplitude signal. In FIG. 1, the transfer buffer includes a transfer gate 1a to transmit complementary internal read data signals DIN, /DIN to amplifier nodes AN, /AN in response to a transfer control signal TXA, an amplifier circuit 2 to amplify the signals on the amplifier nodes in response to amplifier activation signal AME, and a transfer gate 1b to transfer the signals on amplifier nodes AN, /AN in response to a transfer control signal TXB.

Internal data signals DIN, /DIN are small amplitude signals, and amplifier circuit 2 amplifies the small amplitude signals to signals having a power supply voltage level amplitude by the amplification operation. Therefore, transfer data signals DO, /DO from transfer gate 1b become CMOS level signals if transfer gate 1b is conductive for a sufficient period. In the following, the operation of the transfer buffer circuit shown in FIG. 1 will be described with reference to a timing chart shown in FIG. 2.

In data transfer, transfer control signals TXA, TXB are activated for a prescribed period in response to a clock signal CLK. First, transfer control signal TXA attains the high level for a prescribed period in synchronization with a rise of clock signal CLK, transfer gate 1a is rendered conductive, and internal data signals DIN, /DIN are transmitted to amplifier nodes AN, /AN. When the signal potentials on amplifier nodes AN, /AN change sufficiently, amplifier activation signal AME is activated, and the small amplitude signals on amplifier nodes AN, /AN are amplified to signals having power supply and ground voltage levels. When the potentials on amplifier nodes AN, /AN are stabilized, transfer control signal TXB is then activated in response to a fall of clock signal CLK, transfer gate 1b is rendered conductive, and the potentials of transfer data signals DO, /DO change according to the signal potentials on amplifier nodes AN, /AN. When the potentials of transfer data signals DO, /DO change sufficiently, transfer control signal TXB is inactivated and, thereafter or simultaneously, amplifier circuit 2 is also inactivated.

By changing transfer control signals TXA, TXB in synchronization with clock signal CLK so as to transfer signals, data can be output in synchronization with the clock signal in a clock synchronous type semiconductor memory device, for example.

As indicated by the dashed lines in FIG. 1, amplifier nodes AN, /AN have parasitic capacitance due to the gate capacitance and interconnection lines of amplifier circuit 2. The parasitic capacitance accumulates electric charges corresponding to data signals amplified by amplifier circuit 2 in a previous cycle. Therefore, if transfer control signal TXA attains the high level and transfer gate 1a is rendered conductive, electric charges accumulated in the parasitic capacitance flow out to the internal data lines as shown in FIG. 3A. If a circuit drivability for the internal data lines is small, the voltage levels of small amplitude signals or internal data signals DIN, and /DIN may change. Especially if data corresponding to the electric charges accumulated on amplifier nodes AN, /AN is an inversion of the data represented by internal data signals DIN, /DIN, the potential levels of small amplitude data signals DIN, /DIN change. If the amplitudes of internal data signals DIN, /DIN are small, therefore, the amplification operation cannot be performed correctly. Even if the potential levels of small amplitude data signals DIN, /DIN are not inverted, the potential difference between small amplitude signals DIN, /DIN becomes much smaller due to the outflow of electric charges from amplifier nodes AN, /AN, signals with a sufficient amplitude cannot be transmitted to amplifier nodes AN, /AN, and the data amplification operation cannot be performed correctly by amplifier circuit 2 as a result.

Since data is transferred at high speed, if the period during which transfer control signal TXA is active (at the high level) is short as shown in FIG. 3B, sufficient electric charges cannot be transmitted to amplifier nodes AN, IAN even when electric charges do not flow out. Therefore, the signal amplitudes (potential difference) on amplifier nodes AN, /AN are small, and thus amplifier circuit 2 cannot perform the amplification operation correctly.

Therefore, when the power consumption is reduced by transferring internal data in the form of small amplitude complementary signals, the signal amplitudes can be reduced. However, if the speed of clock signal CLK is made higher, then the data cannot be transferred correctly and in synchronization with the clock signal.

The problem as described above is generally observed, for example, in a buffer circuit such as an interface circuit for processing small amplitude signals, not limited to a semiconductor memory device.

SUMMARY OF THE INVENTION

An object of the present invention is to provide a transfer buffer circuit capable of transmitting a signal at high speed in synchronization with a clock signal.

Another object of the present invention is to provide a transfer buffer circuit occupying a small area, consuming a smaller amount of power, and capable of correctly transferring a small amplitude signal at high speed.

A transfer buffer circuit according to the present invention includes an equalize circuit coupled to a pair of internal nodes for equalizing the pair of internal nodes to a prescribed potential, a transfer gate circuit coupled between a pair of first signal lines and the pair of internal nodes for coupling the pair of first signal lines and the pair of internal nodes after equalization is completed, an amplifier circuit for differentially amplifying signals on the pair of internal nodes after transfer is completed by the transfer gate circuit complete the transfer operation, an output transfer circuit for driving a pair of second signal lines according to the signals on the pair of internal nodes in response to an output control signal after the amplifier circuit completes the amplification flow operation, and a control circuit for controlling the operations of the equalize circuit, the transfer gate circuit, the amplifier circuit and the output transfer circuit according to at least a clock signal.

Since the internal nodes of the transfer gate circuit are equalized to a prescribed potential and then supplied with signals to be transferred, the signals, even if they are small amplitude signals, can be transferred without amplitude destruction. Since the control circuit is provided in the transfer buffer circuit, even if a plurality of transfer buffer circuits are provided in parallel, equalization, amplification and transfer can be individually and reliably performed in synchronization with at least the clock signal in each transfer buffer circuit. Therefore, without taking into account signal skew, the signals can be transferred correctly in synchronization with a clock signal even if it is a high speed clock signal is.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 31 shows an arrangement of a buffer circuit according to a sixth embodiment of the present invention.

DESCRIPTION OF THE PREFERRED EMBODIMENTS

First Embodiment

Figure 4:
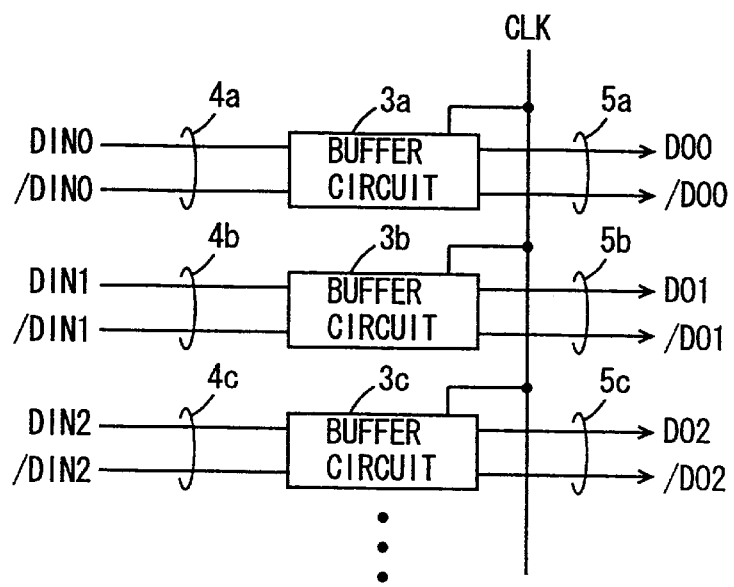
FIG. 4 schematically shows an overall arrangement of a transfer buffer circuit according to a first embodiment of the present invention.

FIG. 4 schematically shows an overall arrangement of a transfer buffer circuit according to a first embodiment of the present invention. In FIG. 4, the transfer buffer circuit includes buffer circuits 3a, 3b, 3c, . . . Provided corresponding to pairs of first internal data lines 4a, 4b, 4c, . . . for transferring complementary data signals DIN0, /DIN0, DIN1, /DIN1, DIN2, /DIN2 on corresponding pairs of first internal data lines 4a, 4b, 4c to pairs of second internal data lines 5a, 5b, 5c in synchronization with a common clock signal CLK. The pairs of first internal data lines 4a, 4b, 4c, . . . are complementary signal lines pairs, and transfer small amplitude signals or complementary data signals DIN0, /DIN0, DIN1, /DIN1, DIN2, /DIN2.

The pairs of second internal data lines 5a, 5b, 5c are also complementary signal line pairs, and transfer complementary data signals DO0, /DO0, DO1, /DO1, DO2, /DO2 applied from corresponding buffer circuits 3a, 3b, 3c. Complementary data signals DO0, /DO0 to DO2, /DO2 on the pairs of second internal data lines 5a to 5c are CMOS level complementary signals or small amplitude complementary signals. The time period during which buffer circuits 3a to 3c drive the corresponding pairs of second internal data lines 5a to 5c determines the amplitudes of transfer data signals DO0, /DO0 to DO2, /DO2. Buffer circuits 3a to 3c operate in parallel in synchronization with clock signal CLK.

Figure 5:
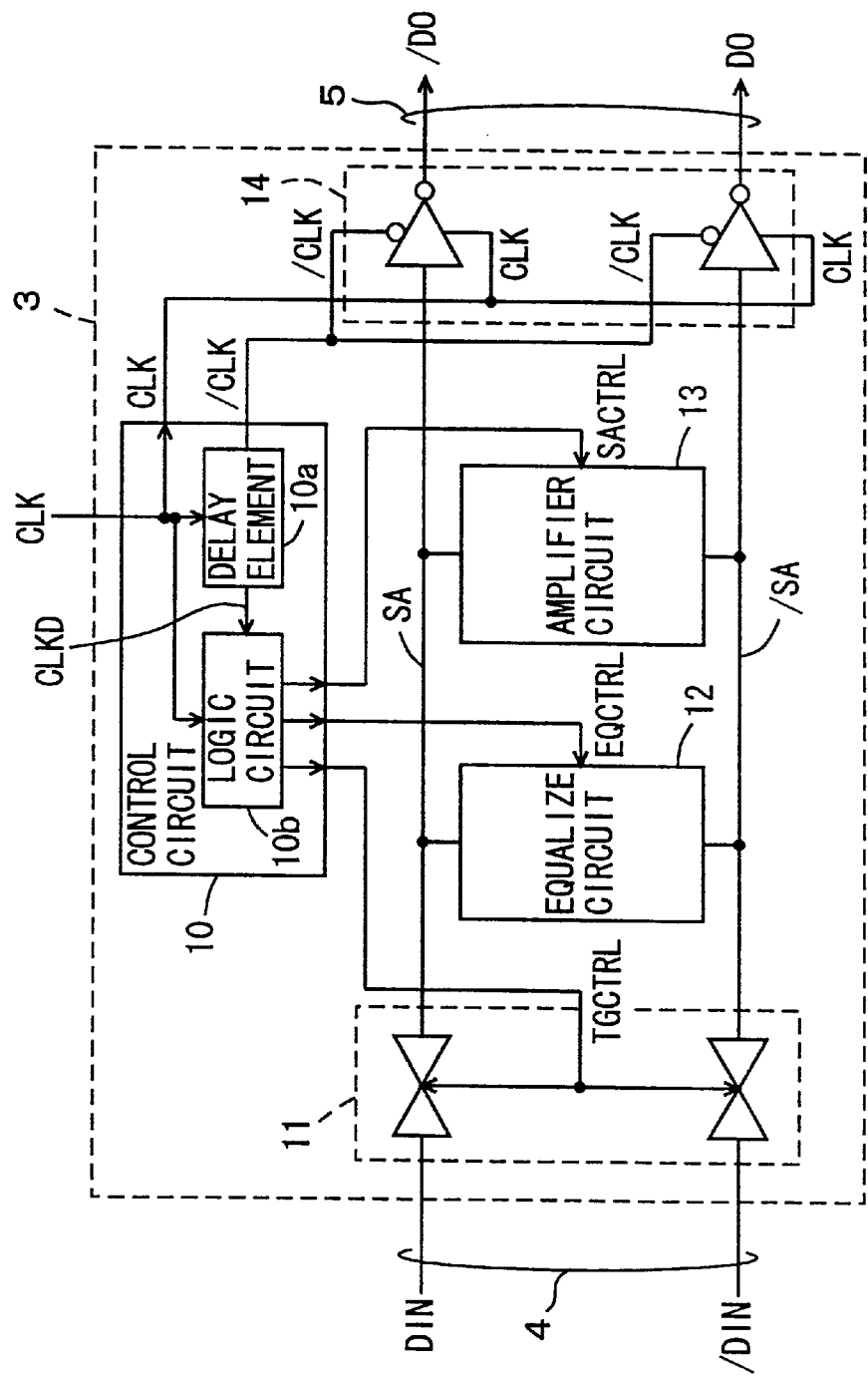
FIG. 5 schematically shows an arrangement of the buffer circuit according to the first embodiment of the present invention.

FIG. 5 schematically shows an arrangement of buffer circuits 3a to 3c shown in FIG. 4. Since buffer circuits 3a to 3c have the same arrangement, one buffer 3 is shown in FIG. 5. In FIG. 5, buffer circuit 3 includes a control circuit 10 generating a complemental clock signal /CLK and various control signals TGCTRL, EQCTRL, SACTRL according to clock signal CLK, a transfer gate circuit 11 for coupling a pair of first internal data lines 4 to amplifier internal nodes SA, /SA according to transfer control signal TGCTRL from control circuit 10, an equalize circuit 12 for equalizing and precharging amplifier internal nodes SA, /SA to a ground voltage level according to equalize control signal EQCTRL from control circuit 10, an amplifier circuit 13 for differentially amplifying signals on amplifier internal nodes SA, /SA according to amplifier control signal SACTRL from control circuit 10, and a clocked gate circuit 14 for transmitting the signals on amplifier internal nodes SA, /SA to a pair of second internal data lines 5 according to complementary clock signals CLK, /CLK from control circuit 10. The pair of first internal data lines 4 are a pair of complementary signal lines, and transfer gate circuit 11 includes transfer gates provided corresponding to the first data signal lines. The pair of second internal data lines 5 are also a pair of complementary signal lines, and clocked gate circuit 14 includes clocked gates provided corresponding to amplifier internal nodes SA, /SA.

Control circuit 10 includes a delay element 10a for delaying clock signal CLK to generate a delayed clock signal CLKD and inverting clock signal CLK to generate complemental clock signal /CLK, and a logic circuit 10b for generating transfer control signal TGCTRL, equalize control signal EQCTRL and amplifier control signal SACTRL according to clock signal CLK and delayed clocked signal CLKD.

Logic circuit 10b activates equalize control signal EQCTRL for a prescribed period in synchronization with a fall of clock signal CLK. When equalize control signal EQCTRL changes from active to inactive states, logic circuit 10b activates transfer control signal TGCTRL. When clock signal CLK rises to the high level, logic circuit 10b inactivates transfer control signal TGCTRL, and then activates amplifier activation signal SACTRL. Amplifier control signal SACTRL is kept active while clock signal CLK is at the high level. When amplifier circuit 13 is activated to perform the amplification operation, clocked gate circuit 14 also operates at the same time to transfer the signals on amplifier internal nodes SA, /SA to the pair of second internal data lines 5. In the following, an operation of buffer circuit 3 will be described with reference to a timing chart shown in FIG. 6.

Figure 6:
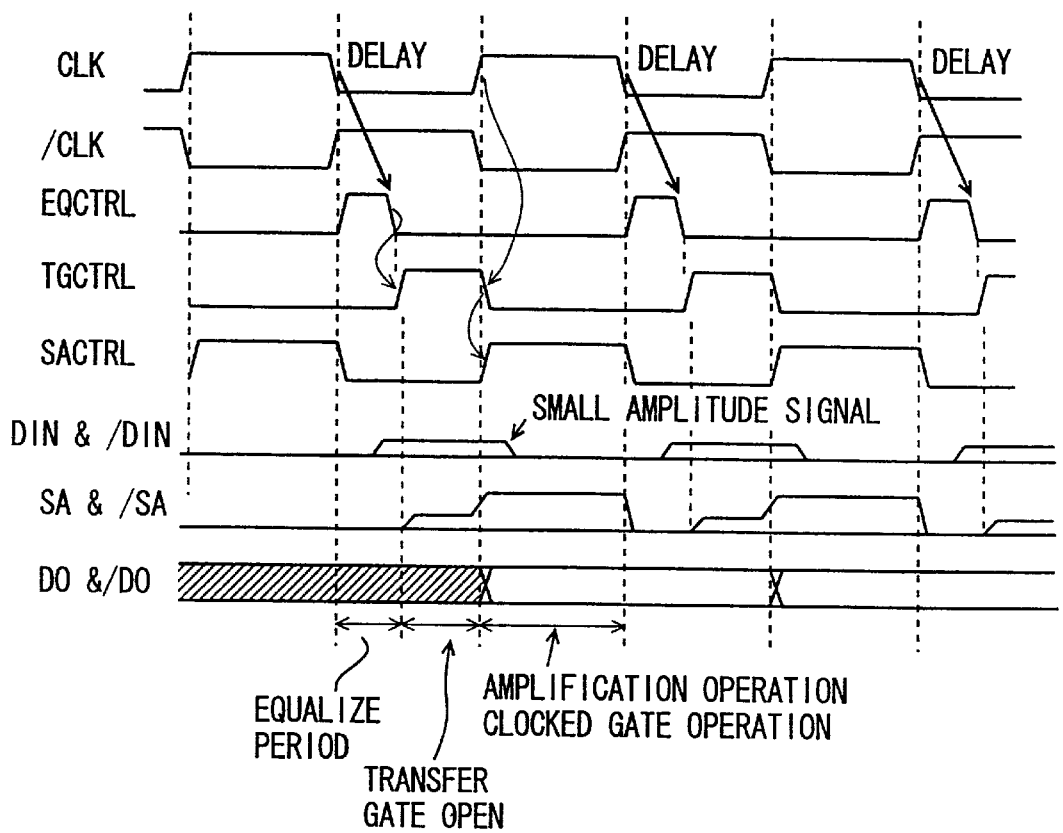
FIG. 6 is a timing chart representing an operation of the buffer circuit shown in FIG. 5.

The pair of first internal data lines 4 are precharged to a ground voltage level before data transfer. Amplifier internal nodes SA, /SA are also equalized to the ground voltage level by equalize circuit 12. In this case, amplifier control signal SACTRL is active as shown in FIG. 6. Even if the voltage on the amplifier internal nodes is changed by amplifier circuit 13, this will not cause any problems because it is merely invalid data. Before data transfer, amplifier control signal SACTRL may kept at inactive state.

When the transfer operation starts, equalize control signal EQCTRL goes high in response to a fall of clock signal CLK, and then equalize control signal EQCTRL is inactivated according to delayed clock signal CLKD. While equalize control signal EQCTRL is active, amplifier internal nodes SA, /Sa are equalized to the ground voltage level by equalize circuit 12. While equalize control signal EQCTRL is high and amplifier internal nodes SA, /SA are being equalized in buffer circuit 3, transfer data is transmitted onto the pair of first internal data lines 4, and the voltage levels of the pair of internal data lines 4 change according to complementary data signals DIN, /DIN.

When equalize control signal EQCTRL is inactivated, transfer control signal TGCTRL goes high, transfer gate 11 is rendered conductive, and thus data signals DIN, /DIN applied on the pair of first internal data lines 4 are transmitted to amplifier internal nodes SA, /SA. Transfer control signal TGCTRL is inactivated when clock signal CLK goes high. Amplifier control signal SACTRL is driven to an active state in response to the rise of clock signal CLK, amplifier circuit 13 is activated, and the signals on amplifier internal nodes SA, /SA are differentially amplified. While clock signal CLK is high, amplifier control signal SACTRL is high, and the data signals amplified to the power supply and ground voltage levels on amplifier internal nodes SA, /SA are held by amplifier circuit 13.

Meanwhile, when clock signal CLK goes high, clocked gate circuit 14 is activated to drive the pair of second data signal lines 5 according to the signals on amplifier internal nodes SA, /SA and to invert the signals on amplifier internal nodes SA, /SA to generate transfer data signals /DO, DO. Clocked gate circuit 14 is a tristate inverter buffer circuit, complementary data signals /DO, DO maintain their potential levels in one clock cycle of clock signal CLK. The series of operations, namely, equalization of the amplifier internal nodes, transfer of data to the amplifier internal nodes, amplification of the signals on the amplifier internal nodes, and transfer to the pair of second internal data lines are repeated according to clock signal CLK while necessary data is transferred.

After amplifier internal nodes SA, /SA are equalized to the ground voltage level, complementary data signals DIN, /DIN are transferred to amplifier internal nodes SA, /SA through transfer gate 11. Thus, it can prevent the outflow of electric charges from amplifier internal nodes SA, /SA to the pair of first internal data lines 4 from changing the potential level of data signals DIN, /DIN. The small amplitude signals can be transferred correctly as a result. After the equalize operation is completed by equalize circuit 12, transfer gate circuit 11 is rendered conductive. Thus, amplifier internal nodes SA, /SA can be set to potential levels according to data signals DIN, /DIN. In the following, a specific arrangement of control circuit 10 will be described.

Figure 7:
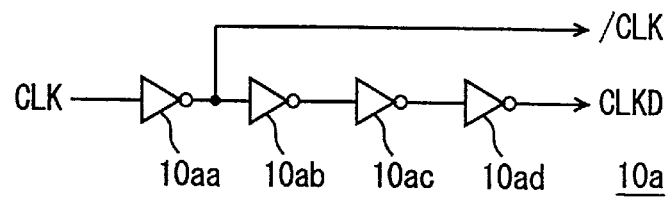
FIG. 7 schematically shows an arrangement of the delay element shown in FIG. 5.

FIG. 7 shows one example of the arrangement of delay element 10a included in control circuit 10 shown in FIG. 5. In FIG. 7, delay circuit 10a includes a plurality of cascaded inverter circuits 10aa to 10ad. Delay element 10a is required to include even number of stages of inverter delay circuits. Cascaded inverter circuits 10a to 10ad of four stages are shown as an example in FIG. 7. Inverter circuit 10aa at the first stage outputs complemental clock signal /CLK. Inverter circuit 10ad at the last stage outputs delayed clock signal CLKD.

Figure 8:
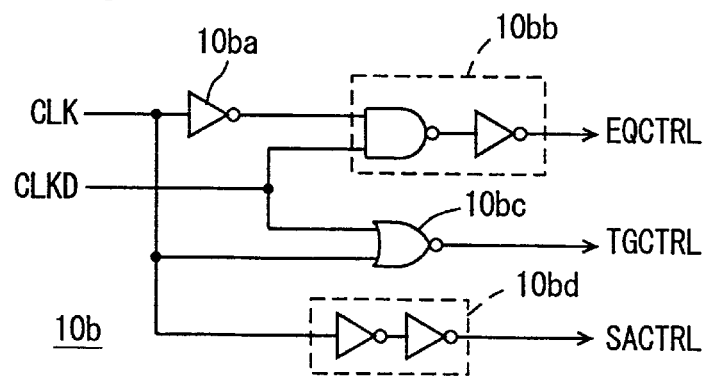
FIG. 8 shows an arrangement of the logic circuit shown in FIG. 5.

FIG. 8 shows one example of the arrangement of logic circuit 10b included in control circuit 10 shown in FIG. 5. In FIG. 8, logic circuit 10b includes an inverter circuit 10ba receiving clock signal CLK, an AND circuit 10bb receiving an output signal of inverter circuit 10ba and delayed clock signal CLKD to generate equalize control signal EQCTRL, an NOR circuit 10bc receiving delayed clock signal CLKD and clock signal CLK to generate transfer control signal TGCTRL, and a buffer circuit 10bd for buffering clock signal CLK and to generate amplifier control signal SACTRL. AND circuit 10bb is formed of an NAND circuit and an inverter circuit receiving an output signal of the NAND circuit. Buffer circuit 10bd is formed of cascaded inverter circuits of plural stages (two stages in FIG. 8).

In the arrangement of logic circuit 10b shown in FIG. 8, while clock signal CLK is low and delayed clock signal CLKD is high, equalize control signal EQCTRL is maintained at the high level or the active state. Therefore, equalize control signal EQCTRL is activated in synchronization with a fall of clock signal CLK and inactivated when delayed clock signal CLKD goes low. A delay period since a falling edge of clock signal is defined by delay element 10a, during which amplifier internal nodes SA, /SA are equalized reliably to the ground voltage level. By providing control circuit 10 in buffer circuit 3, equalize control signal EQCTRL can be generated in synchronization with clock signal CLK in each buffer circuit and, without taking into account the skew of equalize control signal EQCTRL and clock signal CLK, amplifier internal nodes SA, /SA can be equalized reliably to the ground voltage level during the delay time of delay element 10a in each buffer circuit. Furthermore, it is unnecessary to take into account skew to clock signal CLK, and sufficient equalize time can be obtained.

Transfer control signal TGCTRL is activated when delayed clock signal CLKD and clock signal CLK both go low. Transfer control signal TGCTRL is driven to an active state when equalize control signal EQCTRL is inactivated in response to delayed clock signal CLKD. Therefore, transfer control signal TGCTRL can be driven reliably to the active state after the equalization operation is completed.

Amplifier control signal SACTRL is kept active while clock signal CLK is high.

In the arrangement of the control circuit shown in FIGS. 7 and 8, complemental clock signal /CLK may be generated not from delay circuit 10a but from clock signal CLK by using another inverter circuit, or complemental clock signal /CLK may be generated from inverter circuit 10ba shown in FIG. 8.

In addition, transfer control signal TGCTRL may be generated by applying equalize control signal EQCTRL and clock signal CLK to NOR circuit 10bc. In response to equalize control signal EQCTRL becoming inactive, transfer control signal TGCTRL can be driven to the active state.

Figure 9:
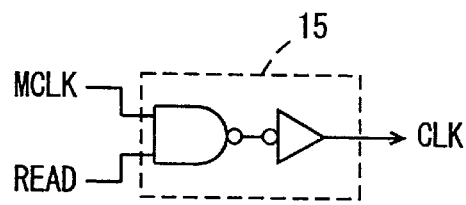
FIG. 9 schematically shows a modification of the clock signal generation unit.

Clock signal CLK may be always generated so that the buffer circuit operates regardless of the presence/absence of data to be transferred. As shown in FIG. 9, however, clock signal CLK may be generated by using an AND circuit 15 receiving a main clock signal MCLK and a read operation activation signal READ. Only while read operation activation signal READ is active, clock signal CLK is generated according to main clock signal MCLK which in turn is an external system clock, for example. Read operation activation signal READ is activated when the internal data transfer operation is to be performed. If the buffer circuit is used to transfer read data in a semiconductor memory device, for example, read operation control signal READ is activated according to a read command for instructing external reading of data. The period during which read operation activation signal READ is active is determined by a burst length which in turn indicates the number of data successively read after read command application.

Although control signals TGCTRL, SACTRL and EQCTRL are positive logic signals in the arrangement of the buffer circuit shown in FIG. 5, they may be negative logic signals. Although transfer data DO, /DO are transferred to the pair of second data lines 5 in synchronization with a rise of clock signal CLK, transfer data DO, /DO may be transferred in response to a fall of the clock signal. The leading edge of the clock signal may be a falling edge. These modifications also hold for the following embodiments.

As described above, according to the first embodiment of the present invention, the internal nodes of the buffer circuit are equalized to the ground voltage level before the transfer gate is rendered conductive, the small amplitude data signals are transferred to the amplifier nodes in the buffer circuit, and then the amplification operation is performed. Therefore, without the disadvantageous influences of the electric charges stored on the internal nodes on the transfer signals, the small amplitude data signals can be correctly received by the buffer circuit, amplified and transferred in synchronization with the clock signal. Since the control circuit is provided in the buffer circuit to generate the equalize control signal, the skew to the clock signal of the equalize control signal does not have to be taken into account, and the equalize time of a sufficient length can be obtained. Furthermore, the control signals can be generated according to the clock signal in each buffer circuit, and thus the transfer operation synchronous with the clock signal can be implemented.

Second Embodiment

Figure 10:
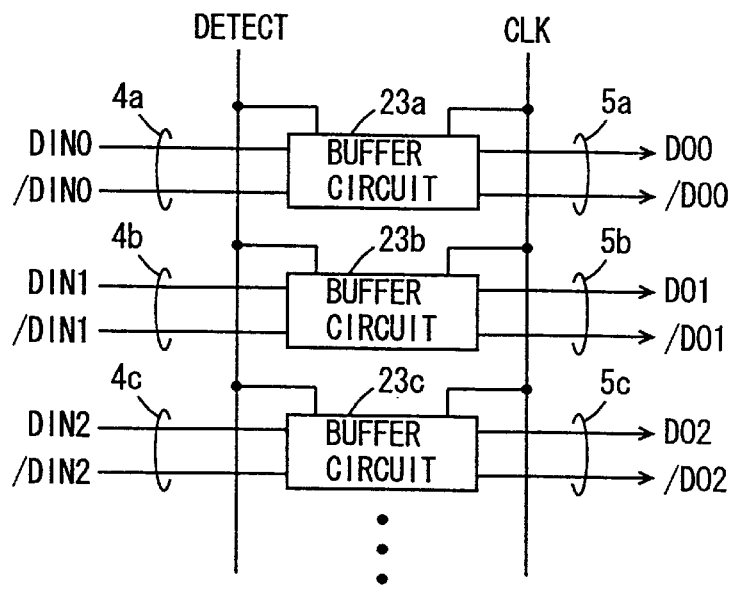
FIG. 10 schematically shows an overall arrangement of a buffer circuit according to a second embodiment of the present invention.

FIG. 10 schematically shows an overall arrangement of a buffer circuit according to a second embodiment of the present invention. In FIG. 10, buffer circuits 23a, 23b, 23c, . . . are provided corresponding to pairs of first internal data lines 4a, 4b, 4c, . . . Buffer circuits 23a, 23b, 23c, . . . output data to pairs 5a, 5b, 5c, . . . of second internal data lines in synchronization with clock signal CLK. Buffer circuits 23a, 23b, 23c, . . . are commonly supplied with a detection period defining signal DETECT. When detection period defining signal DETECT is inactivated, buffer circuits 23a, 23b, 23c, . . . prohibit the corresponding pairs of first internal data lines 4a, 4b, 4c, . . . from receiving signals and then start the amplification operation. In the second embodiment, therefore, the start of the amplification operation is not defined by clock signal CLK but determined by detection period defining signal DETECT. After the amplification operation is performed, buffer circuits 23a, 23b, 23c, . . . output data. Thus, defined data can be output at an advanced timing to the pairs of second data lines 5a, 5b, 5c, . . . in synchronization with clock signal CLK.

Figure 11:
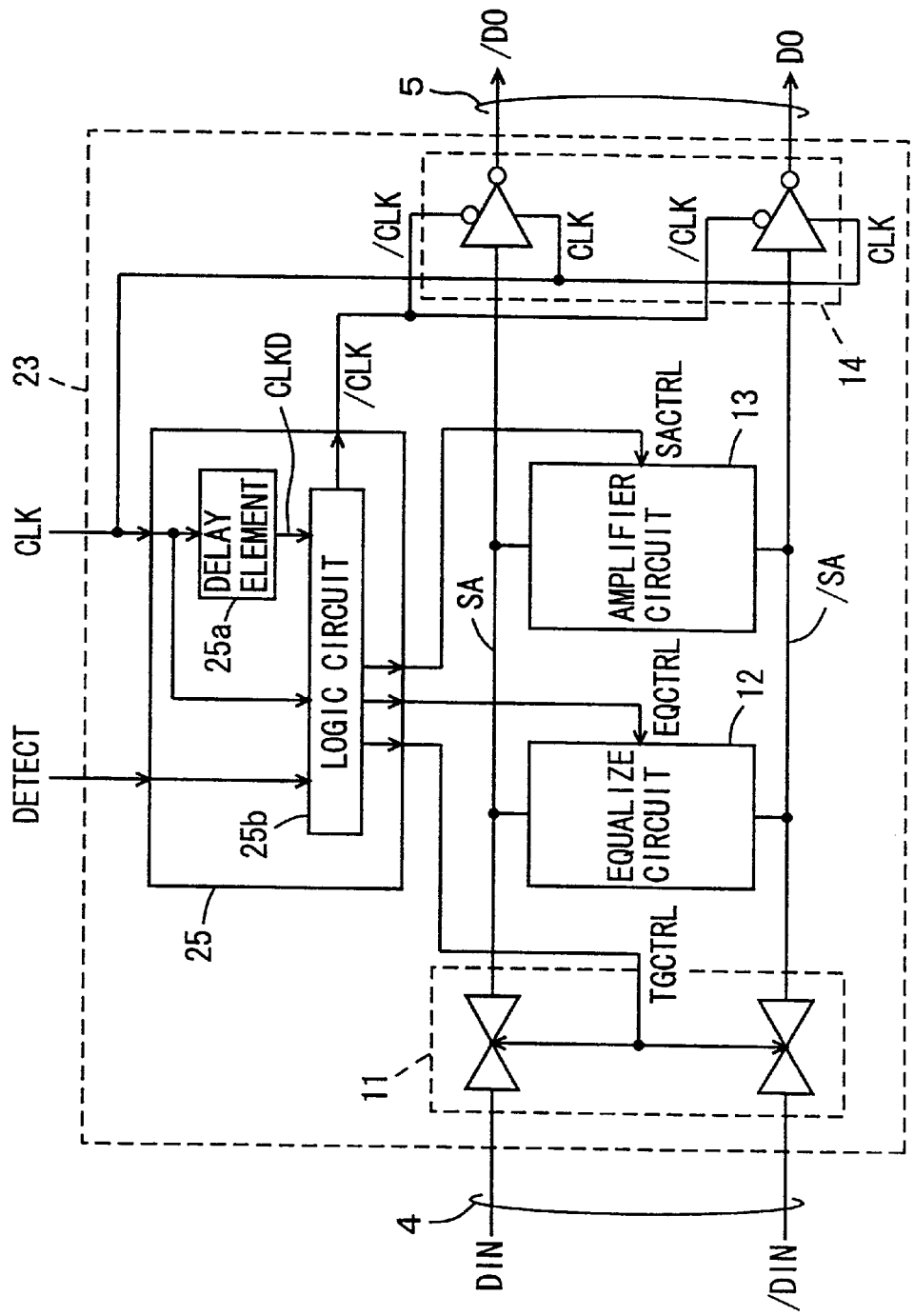
FIG. 11 schematically shows an arrangement of the buffer circuit shown in FIG. 10.

FIG. 11 schematically shows an arrangement of buffer circuits 23a, 23b, 23c, . . . shown in FIG. 10. Since buffer circuits 23a, 23b, 23c, . . . have the same arrangement, one buffer circuit 23 is representatively shown in FIG. 11. Similarly to the first embodiment, buffer circuit 23 includes transfer gate circuit 11, equalize circuit 12, amplifier circuit 13 and clocked gate circuit 14. Their arrangement are the same as in the buffer circuit shown in FIG. 5. Buffer circuit 23 includes a control circuit 25 for generating complemental clock signal /CLK, transfer control signal TGCTRL, equalize control signal EQCTRL and amplifier control signal SACTRL according to clock signal CLK and detection period defining signal DETECT.

Figure 12:
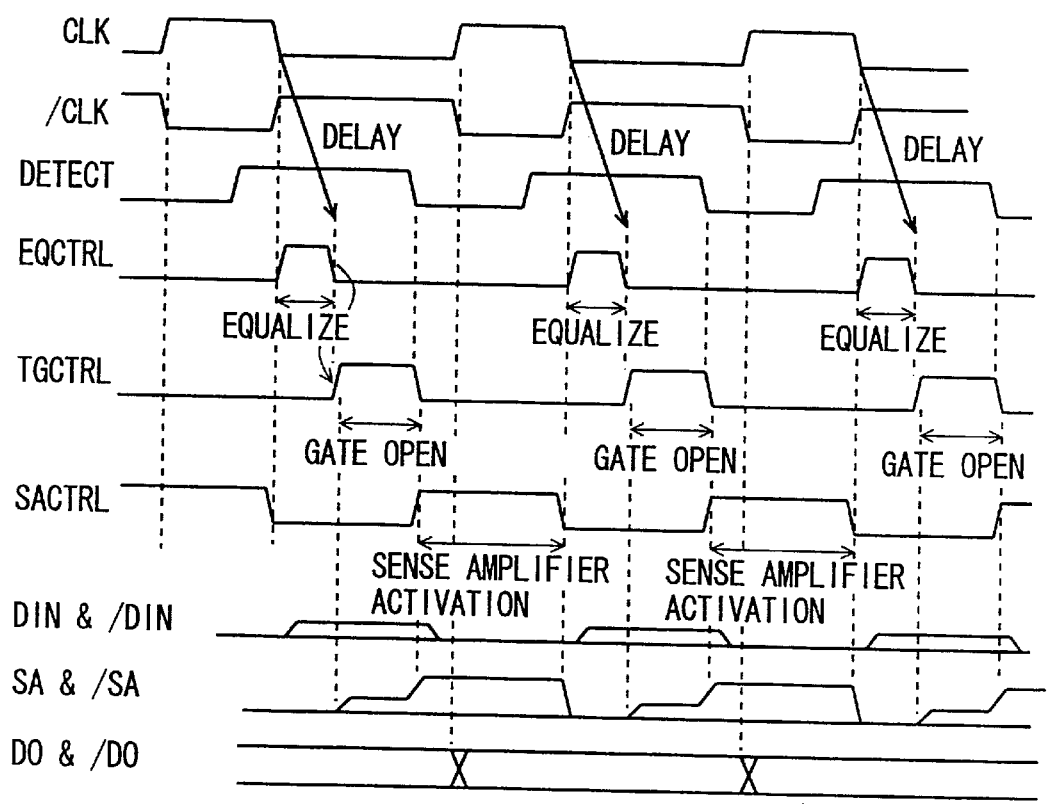
FIG. 12 is a timing chart representing an operation of the buffer circuit shown in FIG. 11.

Control circuit 25 includes a delay element 25a for delaying clock signal CLK to generate delayed clock signal CLKD, and a logic circuit 25b for generating complemental clock signal /CLK and various control signals according to detection period defining signal DETECT, clock signal CLK and delayed clock signal CLKD. In the following, an operation of buffer circuit 23 shown in FIG. 11 will be described with reference to a timing chart shown in FIG. 12.

When clock signal CLK goes high, detection period defining signal DETECT goes high after a prescribed time period. When clock signal CLK then goes low, equalize control signal EQCTRL is activated synchronously, and equalize circuit 12 equalizes amplifier internal nodes SA, /SA to a ground voltage level. After a prescribed time period, delayed clock signal CLKD falls. Then, equalize control signal EQCTRL is inactivated, and the equalization of the internal nodes SA, /SA by equalize circuit 12 is completed. During the equalize operation, data DIN, /DIN on the pair of first internal data lines 4 change according to transfer data (internal read data). When the equalize operation is completed, transfer control signal TGCTRL is activated, transfer gate circuit 11 is rendered conductive, data signals DIN, /DIN on the pair of first internal data lines 4 are transmitted to amplifier internal nodes SA, /SA, and the potential levels on amplifier internal nodes SA, /SA are changed.

Then, detection period defining signal DETECT is driven to an inactive state (low level), transfer control signal TGCTRL is inactivated in response, and transfer gate circuit 11 is rendered non-conductive. When transfer control signal TGCTRL is inactivated, logic circuit 25b activates amplifier control signal SACTRL, and amplifier circuit 13 differentially amplifies the potentials on amplifier internal nodes SA, /SA. Amplifier control signal SACTRL is activated when clock signal CLK is low, and the voltages on amplifier internal nodes SA, /SA are sufficiently amplified by the time when clock signal CLK goes high.

When clock signal CLK goes high thereafter, clocked gate circuit 14 is rendered conductive, the pair of second internal data lines 5 are driven according to the amplified data signals on amplifier internal nodes SA, /SA, and transfer data signals /DO, DO change in response. Amplifier control signal SACTRL is inactivated in synchronization with a fall of clock signal CLK. At this time, clocked gate circuit 14 is rendered non-conductive (entered an output high impedance state), and data signals /DO, DO on the pair of second data lines 5 are maintained. These operations are repeated in each clock cycle of clock signal CLK until all transfer data are transferred.

By using detection period defining signal DETECT to start the amplification operation of amplifier circuit 13 before a rise of clock signal CLK, even if the parasitic capacitance of amplifier internal nodes SA, /SA is large or the amplification operation of amplifier circuit 13 is slow, the data signals on amplifier internal nodes SA, /SA are sufficiently amplified when clock signal CLK rises. Therefore, as soon as clock signal CLK rises, data signals DO, /DO can be output through clocked gate circuit 14, and the data signals can be transferred at high speed.

Figure 13:
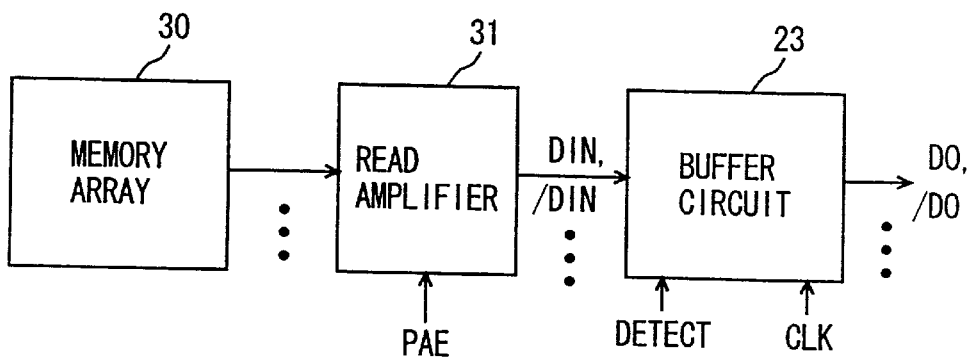
FIG. 13 schematically shows an arrangement of a semiconductor device which includes the buffer circuit.

FIG. 13 shows one example of the application of the buffer circuit. Buffer circuit 23 receives internal read data from a read amplifier 31 amplifying memory cell data read from a memory array 30 in response to a preamplifier activation signal PAE. When buffer circuit 23 is used to transfer internal read data of a memory circuit, detection period defining signal DETECT is generated according to preamplifier activation signal PAE and clock signal CLK and, when data signals DIN, /DIN from read amplifier 31 reach buffer circuit 23 and sufficient voltage change is caused on the internal nodes of buffer circuit 23, detection period defining signal DETECT is inactivated.

Figure 14:
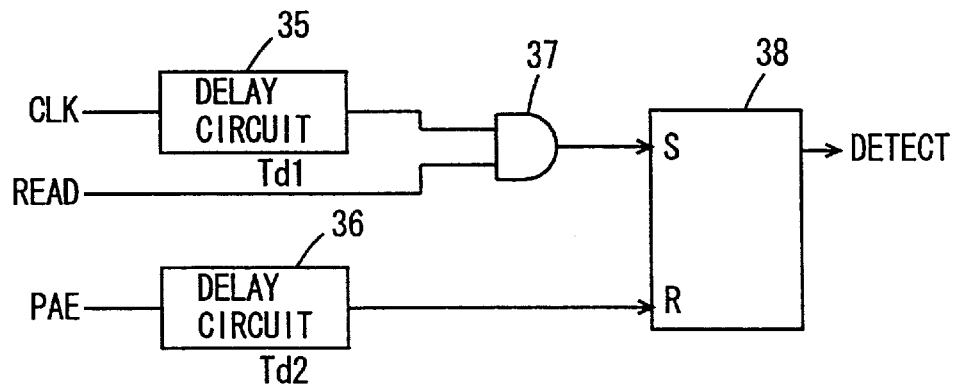
FIG. 14 shows one example of an arrangement of a detection period defining signal generation unit in the environment shown in FIG. 13.
Figure 15:
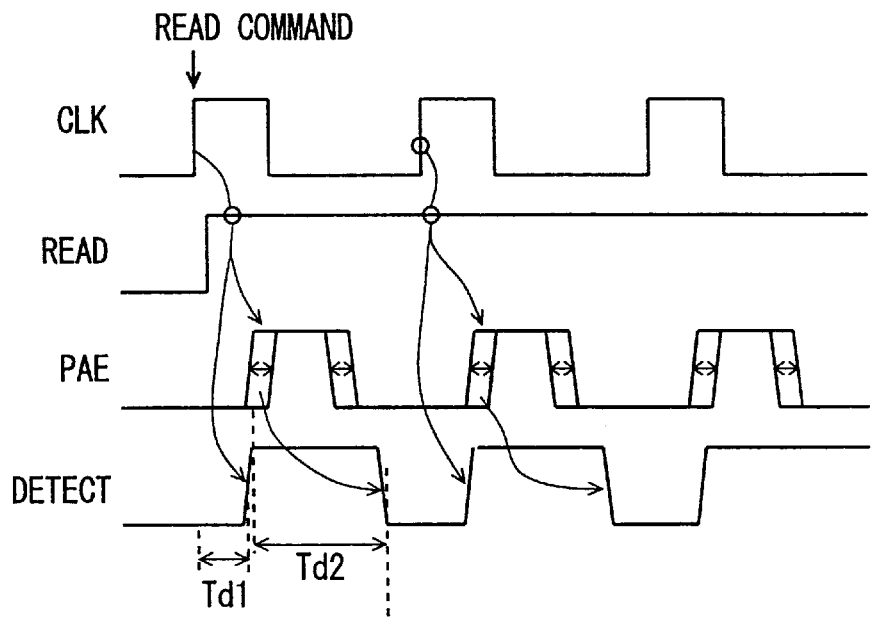
FIG. 15 is a signal waveform diagram representing an operation of the detection period defining signal generation unit shown in FIG. 14.

FIG. 14 shows one example of an arrangement of a detection period defining signal generation unit for the arrangement shown in FIG. 13. In FIG. 14, the detection period defining signal generation unit includes a delay circuit 35 for delaying clock signal CLK by a prescribed period, a delay circuit 36 for delaying preamplifier activation signal PAE, an AND circuit 37 receiving an output signal of delay circuit 35 and data read operation activation signal READ, and a set/reset flip-flop 38 set in response to a rise of an output signal of AND circuit 37 and reset in response to a rise of an output signal of delay circuit 36. Set/reset flip-flop 38 generates detection period defining signal DETECT. In the following, an operation of the detection period defining signal generation unit shown in FIG. 14 will be described with reference to a signal waveform diagram shown in FIG. 15.

When a read command is applied in synchronization with clock signal CLK, read operation activation signal READ is activated for a burst length period, for example. When the read command is applied, preamplifier activation signal PAE is activated for a prescribed period according to the clock signal. The period during which preamplifier activation signal PAE is active and the timing at which preamplifier activation signal PAE is activated are suitably determined according to the frequency of clock signal CLK and column latency (the period necessary for data to be actually read out since application of the read command). Therefore, the activation period of preamplifier activation signal PAE is shown having a certain time width in FIG. 15.

When read operation activation signal READ is activated, AND circuit 37 generates a signal which in turn periodically changes according to the delayed clock signal from delay circuit 35. Therefore, when read operation activation signal READ is activated, detection period defining signal DETECT from set/reset flip-flop 38 is activated with a delay of delay time Td1 corresponding to the delay of delay circuit 35 with respect to a rise of clock signal CLK. After preamplifier activation signal PAE is activated and delay time Td2 of delay circuit 36 passes, set/reset flip-flop 38 is reset, and detection period defining signal DETECT is inactivated to attain the low level. When data is transferred by buffer circuit 23, therefore, detection period defining signal DETECT can be activated periodically. Delay time Td2 of delay circuit 36 is determined, considering the cycle time of clock signal CLK, so that detection period defining signal DETECT is inactivated to the low level within one cycle of clock signal CLK.

If clock signal CLK is generated when read operation activation signal READ is activated as shown in FIG. 9. AND circuit 37 is unnecessary and detection period defining signal DETECT is activated according to the output signal of delay circuit 35.

Figure 16:
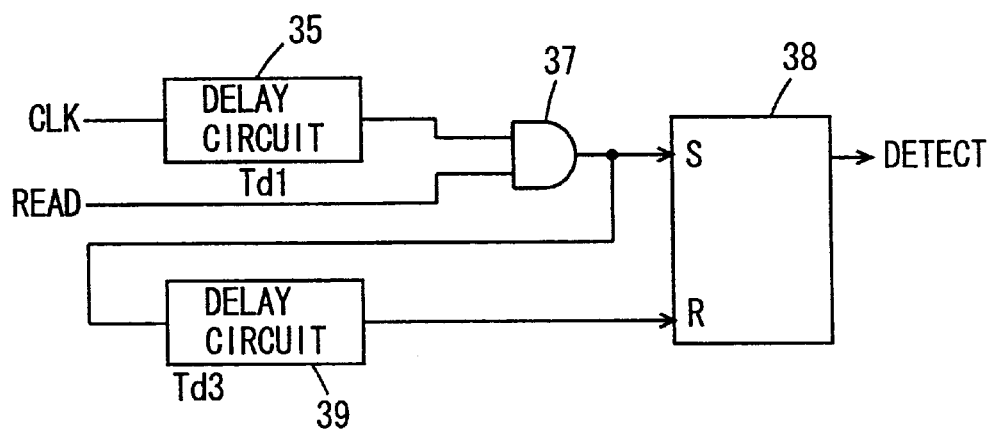
FIG. 16 shows a modification of the detection period defining signal generation unit.
Figure 17:
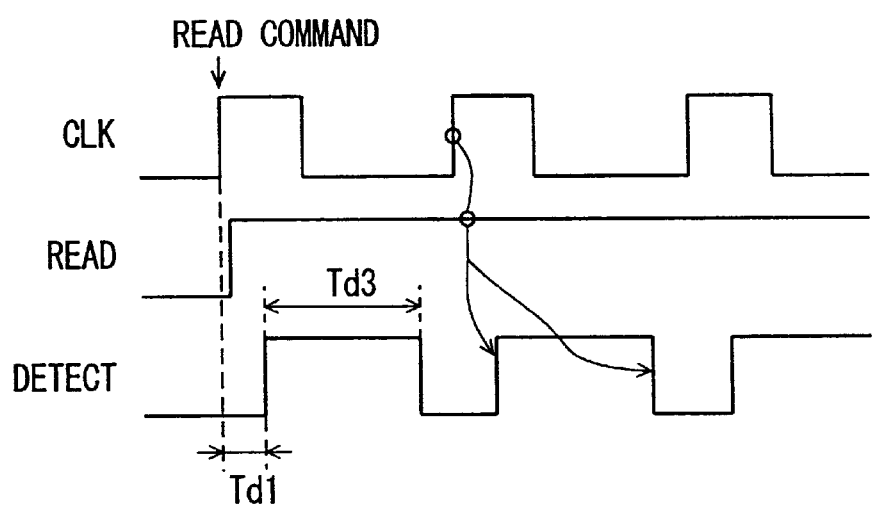
FIG. 17 is a signal waveform diagram representing an operation of the detection period defining signal generation unit shown in FIG. 16.

FIG. 16 shows a modification of the detection period defining signal generation unit. The detection period defining signal generation unit shown in FIG. 16 is different from the arrangement shown in FIG. 14 in the points as described below. In the arrangement shown in FIG. 16, an output signal of AND circuit 37 is applied to a reset input R of set/reset flip-flop 38 through a delay circuit 39, and preamplifier activation signal PAE is not employed. An operation of the detection period defining signal generation unit shown in FIG. 16 will be described with reference to a signal waveform diagram shown in FIG. 17.

When a read command is applied, read operation activation signal READ is activated, and AND circuit 37 operates as a buffer circuit. When delay time td1 of delay circuit 35 elapses after a rise of clock signal CLK, the output signal of AND circuit 37 goes high, set/reset flip-flop 38 is set in response, and detection period defining signal DETECT is activated. When delay time Td3 of delay circuit 39 elapses after the rise of the output signal of AND circuit 37, an output signal of delay circuit 39 goes high, set/reset flip-flop 38 is reset, and detection period defining signal DETECT is inactivated. These operations are repeated in synchronization with clock signal CLK while read operation activation signal READ is active.

Figure 18:
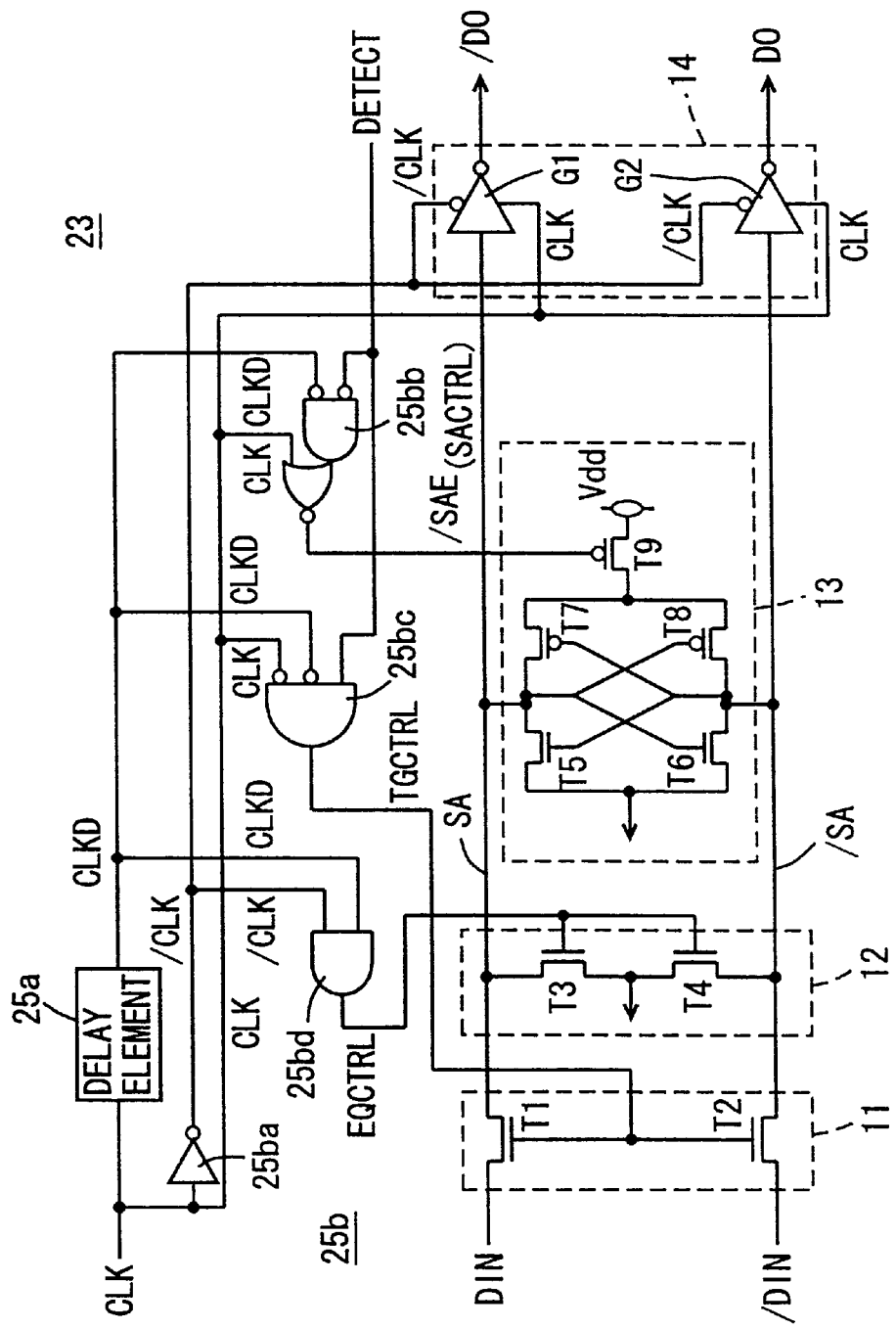
FIG. 18 shows a more specific arrangement of the buffer circuit shown in FIG. 11.

FIG. 18 shows a specific arrangement of the buffer circuit shown in FIG. 11. Transfer gate circuit 11 includes transfer gates T1, T2 formed of N channel MOS transistors and provided for data signals DIN, /DIN.

Equalize circuit 12 includes N channel MOS transistors T3, T4 which are rendered conductive, when equalize control signal EQCTRL is activated, to drive amplifier internal nodes SA, /SA to the ground voltage level.

Amplifier circuit 13 includes cross-coupled N channel MOS transistors T5, T6, cross-coupled P channel MOS transistors T7, T8, and a P channel MOS transistor T9 receiving sense activation signal /SAE (amplifier control signal SACTRL) at its gate to transmit a power supply voltage Vdd to the sources of P channel MOS transistors T7, T8. The drains of MOS transistors T5, T7 are connected to amplifier internal node SA, and the drains of MOS transistors T6, T8 are connected to amplifier internal node /SA. The sources of MOS transistors T5, T6 are connected to a ground node, Clocked gate circuit 14 includes a tristate inverter buffer circuit G1 that is provided for amplifier internal node SA and activated when clock signal CLK is high, and a clocked inverter buffer circuit G2 that is provided for amplifier internal node /SA and activated, when clock signal CLK is high, to invert and output a signal on amplifier internal node /SA.

In amplifier circuit 13, MOS transistors T5, T6 discharge a node at a lower potential of amplifier internal nodes SA, /SA to the ground voltage level. Differential amplification by MOS transistors T7, T8 is activated according to sense amplifier activation signal /SAE, and the potential of a node at a higher potential of amplifier internal nodes SA, /SA is raised to the power supply voltage Vdd level. Thus, the small amplitude signals on amplifier internal nodes SA, /SA are differentially amplified, and CMOS level signals are generated and latched.

Logic circuit 25b included in control circuit 25 has an inverter circuit 25ba receiving clock signal CLK and to generate complementary clock signal /CLK, an NOR/NOR composite gate 25bb receiving clock signal CLK, delayed clock signal CLKD from delay element 25a and detection period defining signal DETECT to generate sense activation signal /SAE (sense control signal SACTRL), a gate circuit 25bc receiving clock signal CLK, delayed clock signal CLKD and detection period defining signal DETECT to output transfer control signal TGCTRL, and an AND circuit 25bd receiving complementary clock signal /CLK and delayed clock signal CLKD to generate equalize control signal EQCTRL.

NOR/NOR composite gate 25bb is functionally equivalent to an arrangement that includes an NOR gate receiving delayed clock signal CLKD and detection period defining signal DETECT and an NOR gate receiving an output signal of the NOR gate and clock signal CLK. After delayed clock signal CLKD falls to the low level, the equalize operation of equalize circuit 12 is completed, and detection period defining signal DETECT falls to the low level, then NOR/NOR composite gate 25bb drives sense activation signal /SAE to the low level or the active state and maintains sense activation signal /SAE at the low level or the active state while clock signal CLK is high.

Gate circuit 25bc drives transfer control signal TGCTRL to the high level or the active state when detection period defining signal DETECT is high and clock signal CLK and delayed clock signal CLKD both attain the low level. In other words, when clock signal CLK and delayed clock signal CLKD both attain the low level, and the equalize operation of equalize circuit 12 is completed, transfer gate circuit 11 is rendered conductive in response to transfer control signal TGCTRL, and small amplitude data signals DIN, /DIN are transmitted through transfer gates T1, T2 to amplifier internal nodes SA, /SA.

When complementary clock signal /CLK and delayed clock signal CLKD are both high, AND circuit 25bd maintains equalize control signal EQCTRL in the active state and, during this time, equalize circuit 12 equalizes amplifier internal nodes SA, /SA to the ground voltage level.

Clocked gate circuit 14 transfers inverted data signals of the data signals on amplifier internal nodes SA, /SA according to clock signal CLK and complementary clock signal /CLK. Sense activation signal /SAE (amplifier control signal SACTRL) is driven to the inactive state when detection period defining signal DETECT is high and clock signal CLK falls to the low level. In other words, sense activation signal /SAE is activated while clock signal CLK is high or while detection period defining signal DETECT is low.

By utilizing the cross-coupled type amplifier circuit as amplifier circuit 13 as shown in FIG. 18, the minute signal potential difference on amplifier internal nodes SA, /SA can be amplified at high speed.

As described above, according to the second embodiment of the present invention, the detection period defining signal is utilized to start the amplification operation of the amplifier circuit before activation of the clocked gate circuit, amplified data signals are already produced on amplifier internal nodes SA, /SA when the clocked gate circuit operates, and data can be transferred at high speed in synchronization with a rise of clock signal CLK.

Third Embodiment

Figure 19:
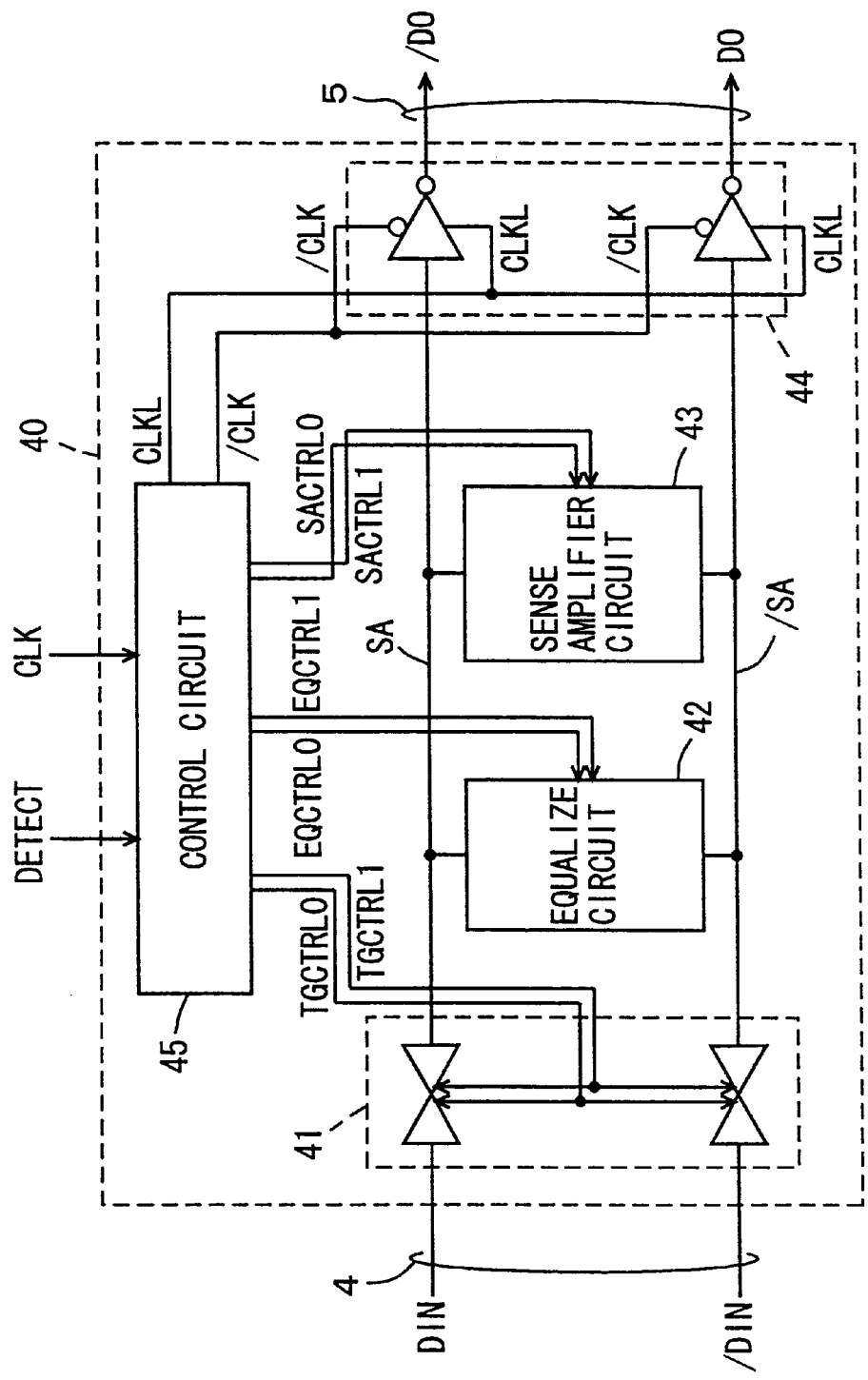
FIG. 19 shows an arrangement of a buffer circuit according to a third embodiment of the present invention.

FIG. 19 schematically shows an arrangement of a buffer circuit according to a third embodiment of the present invention. In FIG. 19, a buffer circuit 40 includes a transfer gate circuit 41 for transmitting data signals DIN, /DIN on a pair of first internal data lines 4 to amplifier internal nodes SA, /SA in response to transfer control signals TGCTRL0, TGCTRL1, an equalize circuit 42 for equalizing amplifier internal nodes SA, /SA to a ground voltage level in response to equalize control signals EQCTRL0, EQCTRL1, a sense amplifier circuit 43 for differentially amplifying the signal potentials on amplifier internal nodes SA, /SA in response to amplifier control signals SACTRL0, SACTRL1, and a clocked gate circuit 44 for transmitting the signals on amplifier internal nodes SA, /SA to a pair of second internal data lines 5 in response to clock signals CLKL, /CLK. Clock signal CLKL is produced by inverting complementary clock signal /CLK and equivalent to buffered clock signal CLK. Buffer circuit 40 further includes a control circuit 45 for generating the above described control signals according to detection period defining signal DETECT and clock signal CLK.

By buffering clock signal CLK in buffer circuit 41 to generate local clock signal CLKL, the control operation synchronous with clock signal CLK can be implemented correctly in buffer circuit 40. Transfer gate circuit 41, equalize circuit 42 and sense amplifier circuit 43 each are supplied with two control signals to simplify the arrangement of control circuit 45 as described below.

Figure 20:
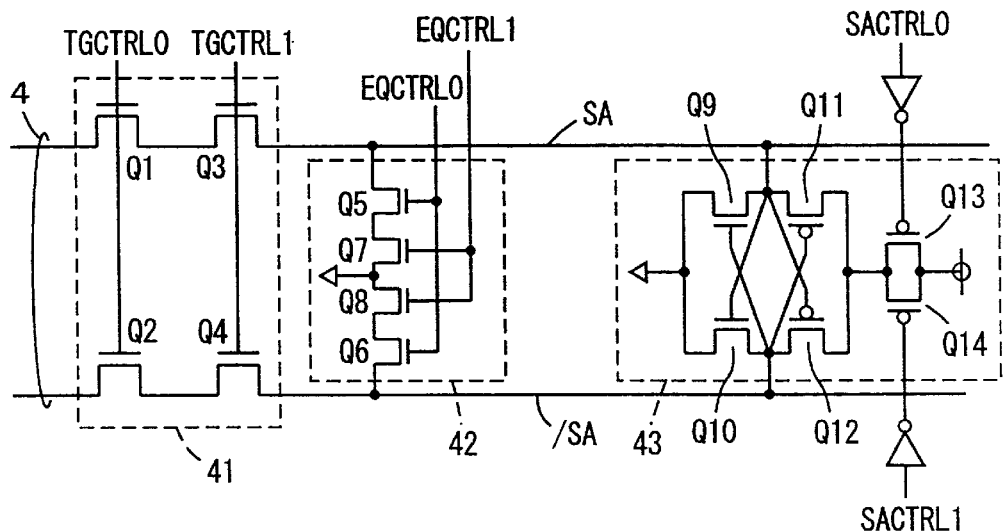
FIG. 20 shows in detail an arrangement of a main part of the buffer circuit shown in FIG. 19.

FIG. 20 shows one example of the arrangement of transfer gate circuit 41, equalize circuit 42 and sense amplifier circuit 43 in buffer circuit 40 shown in FIG. 19. In FIG. 20, equalize circuit 41 includes N channel MOS transistors Q1, Q2 provided for the pair of first internal data lines 4 and receiving transfer control signal TGCTRL0 at their gates, and N channel MOS transistors Q3, Q4 connected in series with MOS transistors Q1, Q2 and receiving transfer control signal TGCTRL1 at their gates. When transfer control signals TGCTRL0, TGCTRL1 both attain the high level or the active state, transfer gate circuit 41 is rendered conductive, and data signals on the pair of first internal data lines 4 are transmitted to amplifier internal nodes SA, /SA.

Equalize circuit 42 includes an N channel MOS transistor Q5 connected to amplifier internal node SA at one conduction node and receiving equalize control signal EQCTRL0 at its gate, an N channel MOS transistor Q6 connected to amplifier internal node /SA at one conduction node and receiving equalize control signal EQCTRL0 at its gate, an N channel MOS transistor Q7 connected between MOS transistor Q5 and a ground node and receiving equalize control signal EQCTRL1 at its gate, and an N channel MOS transistor Q8 connected between MOS transistor Q6 and the ground node and receiving equalize control signal EQCTRL1 at its gate. Even in equalize circuit 42, when equalize control signals EQCTRL0, EQCTRL1 both attain the active state or the high level, MOS transistors Q5 to Q8 turn on and amplifier internal nodes SA, and /SA are equalized to the ground voltage level.

Figure 21:
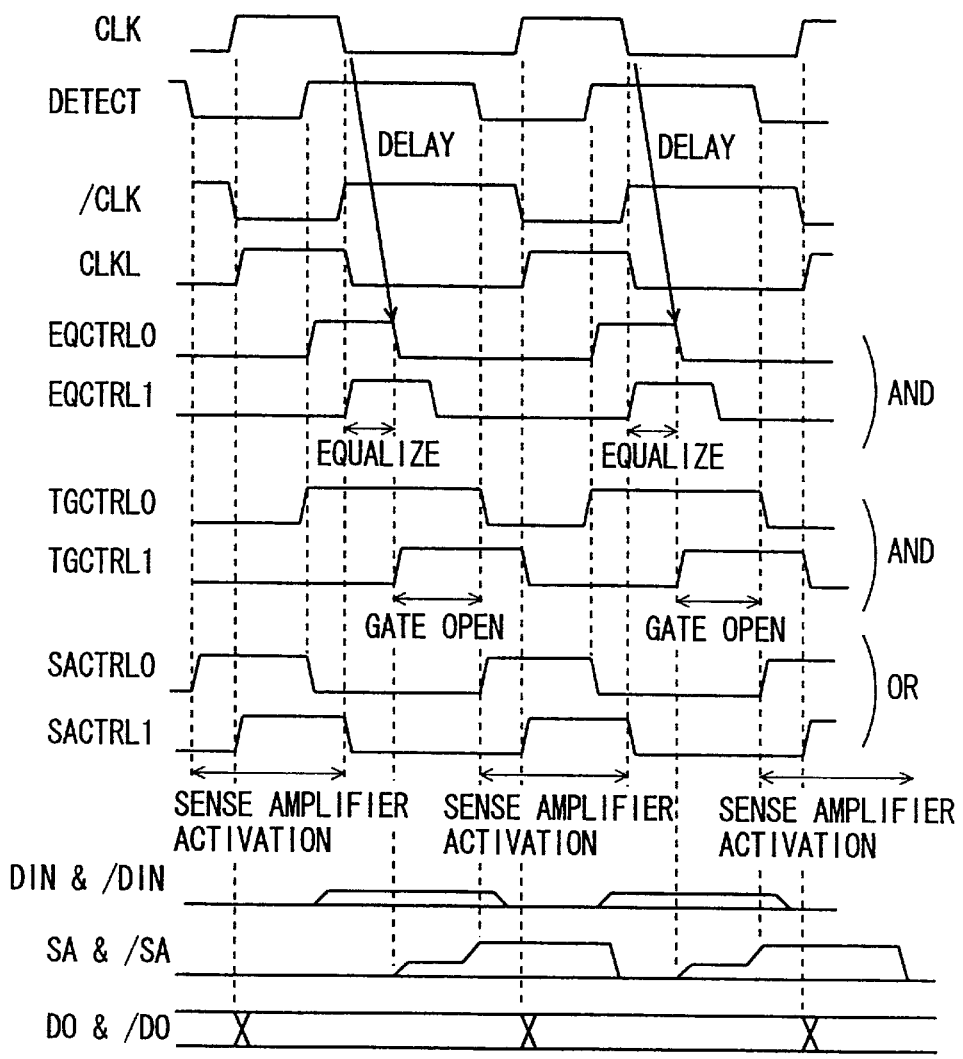
FIG. 21 is a timing chart representing an operation of the buffer circuit shown in FIG. 19.

Sense amplifier circuit 43 includes cross-coupled N channel MOS transistors Q9, Q10, cross-coupled P channel MOS transistors Q11, Q12, a P channel MOS transistor Q13 receiving sense control signal SACTRL0 at its gate through an inverter to transmit, when conductive, a power supply voltage to the sources of P channel MOS transistors Q11, Q12, and a P channel MOS transistor Q14 rendered conductive in response to reception of sense control signal SACTRL1 at its gate through an inverter and transmitting, when conductive, the power supply voltage to the sources of MOS transistors Q11, Q12. Since P channel MOS transistors Q13, Q14 for activating the sense amplifier are connected in parallel, sense amplifier circuit 43 is activated to differentially amplify the potentials on amplifier internal nodes SA, /SA when one of sense control signals SACTRL0 and SACTRL is active. Here, the sources of N channel MOS transistors Q9, Q10 are connected to the ground node. In the following, an operation of buffer circuit 40 will be described with reference to a timing chart shown in FIG. 21.

Control circuit 45 generates various control signals according to clock signal CLK and detection period defining signal DETECT. During the transfer operation, sense control signal SACTRL0 is activated in synchronization with detection period defining signal DETECT. In other words, while detection period defining signal DETECT is low, sense control signal SACTRL0 is made active, and sense amplifier circuit 43 carries out the sensing operation. Furthermore, sense control signal SACTRL1 is activated in synchronization with clock signal CLK. Therefore, similarly to the second embodiment, the combined sense control signal is active while detection period defining signal DETECT is low or clock signal CLK is high. In sense amplifier circuit 43, therefore, P channel MOS transistors Q13, Q14 are rendered conductive according to sense control signals SACTRL0, SACTRL1. Sense amplifier circuit 43 performs the sensing operation and the latching operation while one of sense control signals SACTRL0, SACTRL1 is active. Clocked gate circuit 44 performs the data transfer operation in synchronization with clock signals CLKL, /CLK, and inverts and transmits signals on amplifier internal nodes SA, /SA to the pair of second internal data lines when sense control signal SACTRL1 is activated.

When detection period defining signal DETECT rises to the high level, equalize control signal EQCTRL0 first attains the high level or the active state, and equalize control signal EQCTRL1 then rises to the high level in response to a rise of complementary clock signal /CLK. Equalize control signal EQCTRL0 is inactivated in response to signal CLKD of a delayed signal of clock signal CLK. In equalize circuit 42, therefore, while control signals EQCTRL0, EQCTRL1 are both high, MOS transistors Q5 to Q8 are rendered conductive to equalize the potentials on amplifier internal nodes SA, /SA to the ground potential level.

Transfer control signal TGCTRL0 changes in synchronization with detection period defining signal DETECT, while transfer control signal TGCTRL1 rises to the high level when equalize control signal EQCTRL0 attains the low level and falls to the low level when clock signal CLKL attains the high level. Therefore, transfer gate circuit 41 is conductive while transfer control signals TGCTRL0, TGCTRL1 are both high, that is, when equalize control signal EQCTRL0 goes low and the equalize operation of equalize circuit 42 is completed, and transfer gate circuit 41 is rendered non-conductive when detection period defining signal DETECT goes low and the sensing operation is started.

When transfer gate circuit 41 is rendered non-conductive, sense amplifier circuit 43 starts the sensing operation according to sense control signal SACTRL0. Therefore, similarly to the second embodiment above, sense amplifier circuit 43 completes the sensing operation before the transfer operation of clocked gate circuit 44, and thus data can be transferred at high speed. Furthermore, the control signals can be formed based on clock signal CLK and detection period defining signal DETECT, and the circuit configuration for generating the control signals can be simplified.

Figure 22:
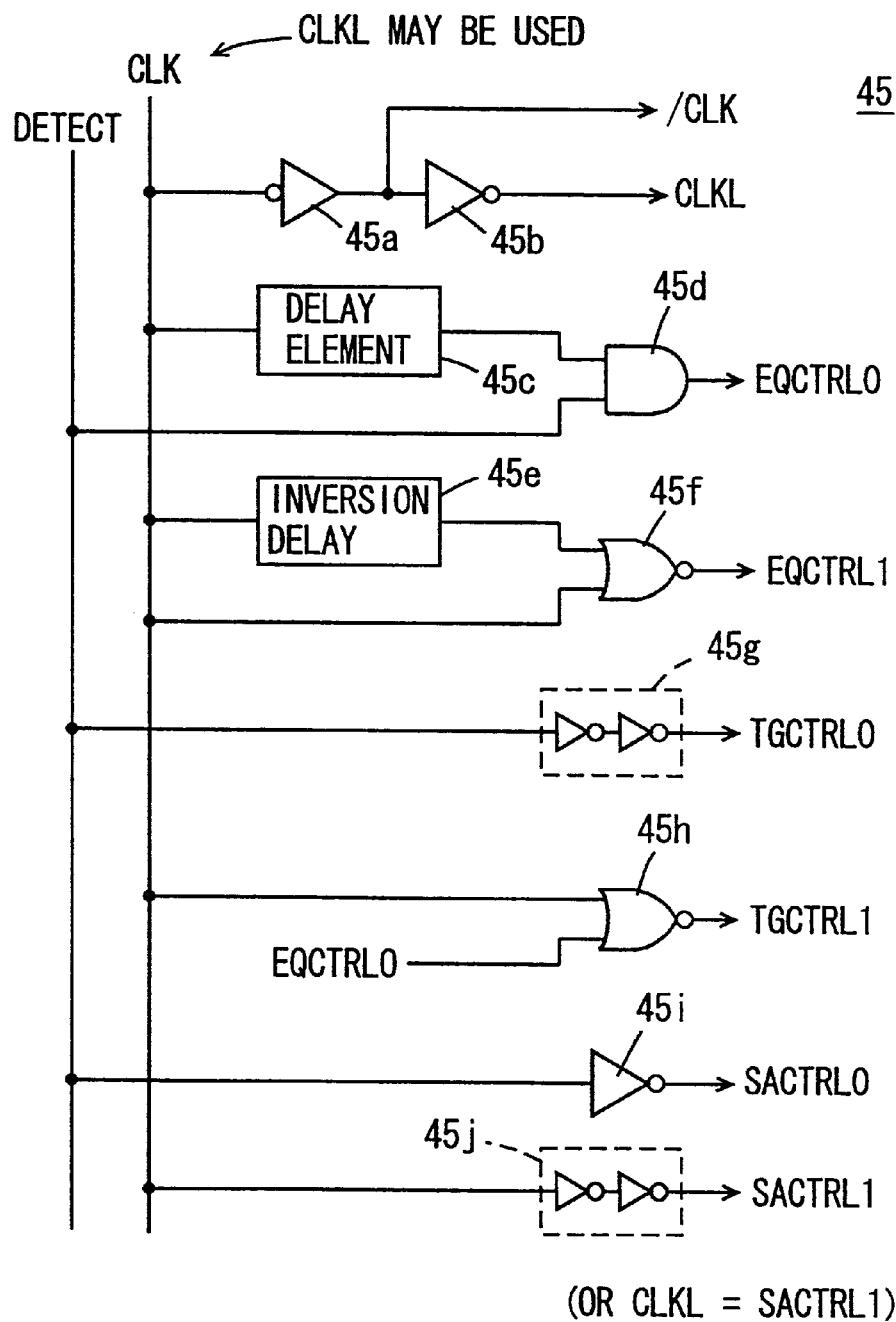
FIG. 22 shows one example of an arrangement of the control circuit shown in FIG. 19.

FIG. 22 shows one example of the arrangement of control circuit 45 shown in FIG. 19. In FIG. 22, control circuit 45 includes an inverter circuit 45a receiving clock signal CLK to generate complementary clock signal /CLK, an inverter circuit 45b receiving complementary clock signal /CLK output from inverter circuit 45a to generate local clock signal CLKL, a delay element 45c for delaying clock signal CLK by a prescribed period, an AND circuit 45d receiving detection period defining signal DETECT and an output signal of delay element 45c to generate equalize control signal EQCTRL0, an inversion delay element 45e for delaying by a prescribed period and inverts the signal, an NOR circuit 45f receiving an output ing signal of inversion delay element 45e and clock signal CLK to generate equalize control signal EQCTRL1, a buffer circuit 45g buffering detection period defining signal DETECT to generate transfer control signal TGCTRL0, an NOR circuit 45h receiving clock signal CLK and equalize control signal EQCTRL0 to generate transfer control signal TGCTRL1, an inverter circuit 45i receiving detection period defining signal DETECT to generate sense control signal SACTRL0, and a buffer circuit 45j buffering the clock signal to generate sense control signal SACTRL1. Sense control signal SACTRL1 may be generated from local clock signal CLKL.

Complemental clock signal /CLK is an inverted signal of clock signal CLK, and local clock signal CLKL is an inversion of inverted clock signal /CLK.

Equalize control signal EQCTRL0 is active when detection period defining signal DETECT is high and the output signal of delay element 45c is high. Equalize control signal EQCTRL1 is high or active when clock signal CLK is low and the output signal of inversion delay element 45e is low. If the delay time of delay element 45c and that of inversion delay element 45e are the same, equalize control signal EQCTRL1 maintains the high level during the delay time of inversion delay element 45e of clock signal CLK falls.

Transfer control signal TGCTRL0 changes in synchronization with detection period defining signal DETECT. Transfer control signal TGCTRL1 goes high when clock signal CLK is low and equalize control signal EQCTRL0 goes low. Therefore, transfer control signal TGCTRL1 is driven to the high level or the active state when the equalize operation of the equalize circuit is completed.

Sense control signal SACTRL0 changes in synchronization with detection period defining signal DETECT, and sense control signal SACTRL1 changes in synchronization with clock signal CLKL.

In control circuit 45, the control signals are generated as shown in FIG. 22 according to clock signal CLK and detection period defining signal DETECT by the gate circuit of a simple basic structure, and thus the arrangement for generating the control signals can be simplified.

In the arrangement shown in FIG. 22, the control signals may be generated according to local clock signal LCLK instead of clock signal CLK. In this arrangement, even if clock signal CLK is applied commonly to a plurality of buffer circuits, the control signals are generated according to local clock signal LCLK in each buffer circuit. Thus, the loads on the clock generation circuit for generating clock signal CLK can be reduced, and high speed clock signal CLK with less waveform rounding can be transmitted to each buffer circuit. Since local clock signal LCLK is utilized in each buffer circuit, the various control signals can be generated correctly according to local clock signal CLKL which in turn is not distorted.

As described above, according to the third embodiment of the present invention, the circuit components in the buffer circuit are controlled by using a plurality of control signals, and thus the logic of the control circuit generating the control signals can be simplified.

Fourth Embodiment

Figure 23:
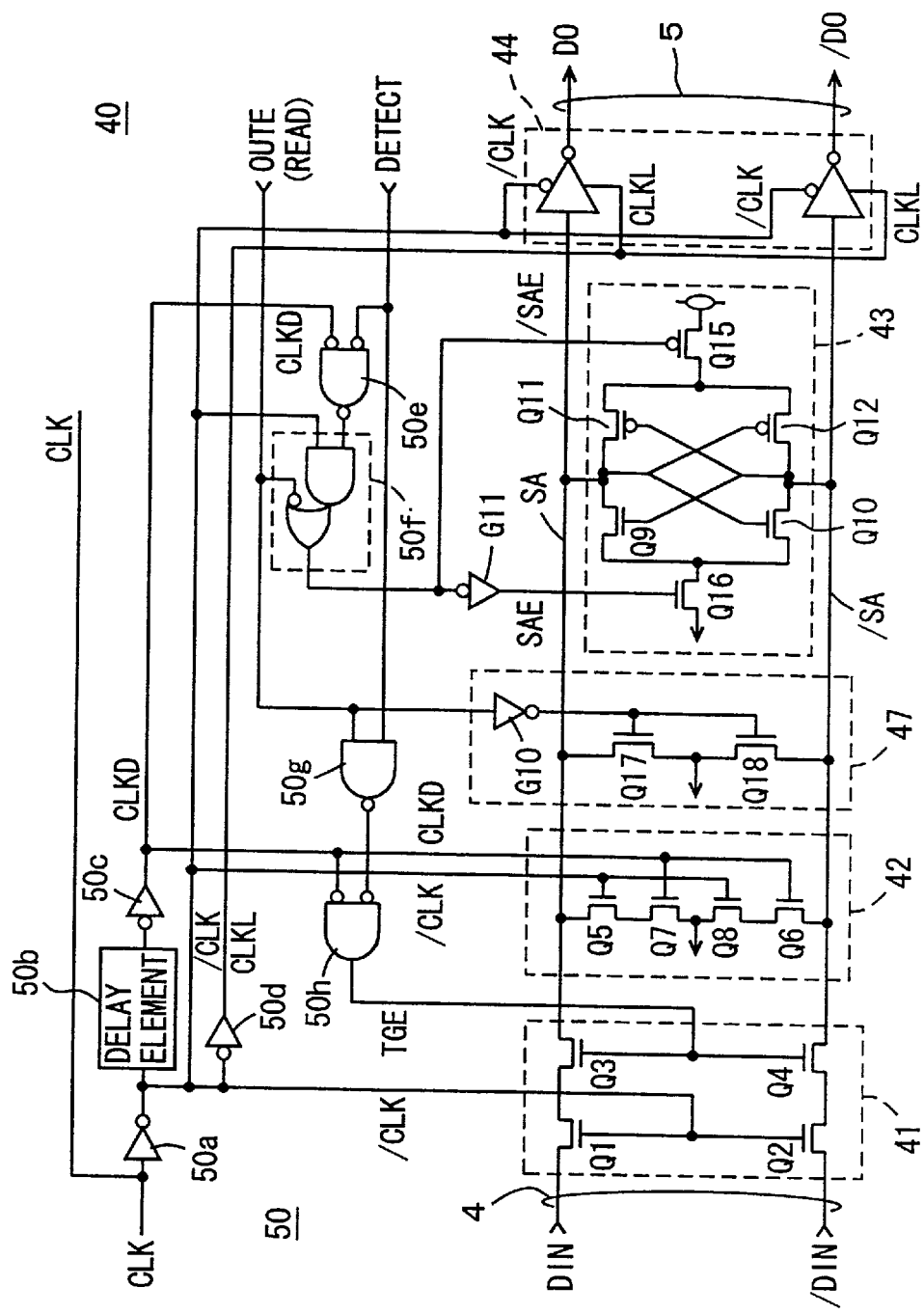
FIG. 23 shows an arrangement of a buffer circuit according to a fourth embodiment of the present invention.

FIG. 23 schematically shows an arrangement of a buffer circuit 40 according to a fourth embodiment of the present invention. In FIG. 23, buffer circuit 40 includes transfer gate circuit 41, equalize circuit 42, sense amplifier circuit 43 and clocked gate circuit 44 similarly to the above described buffer circuit shown in FIG. 20.

Transfer gate circuit 41 includes N channel MOS transistors Q1, Q2 receiving complemental clock signal /CLK at their gates, and N channel MOS transistors Q3, Q4 connected in series with MOS transistors Q1, Q2 and receiving a transfer enable signal TGE at their gates.

Equalize circuit 42 includes N channel MOS transistors Q5, Q7 connected in series between amplifier internal node SA and a ground node, and N channel MOS transistors Q6, Q8 connected in series between amplifier internal node /SA and the ground node. The gates of MOS transistors Q5, Q6 are supplied with delayed clock signal CLKD, and the gates of MOS transistors Q7, Q8 are supplied with complemental clock signal /CLK.

Sense amplifier circuit 43 includes cross-coupled N channel MOS transistors Q9, Q10, cross-coupled P channel MOS transistors Q11, Q12, a P channel MOS transistor Q15 rendered conductive, when sense activation signal /SAE is activated, to transmit power supply voltage Vdd to the sources of MOS transistors Q11, Q12, and an N channel MOS transistor Q16 rendered conductive, when sense activation signal SAE is activated, to transmit the ground voltage to the sources of MOS transistors Q9, Q10.

Buffer circuit 40 further includes an output control circuit 47 activated, when an output enable signal OUTE is inactivated, to fix amplifier internal nodes SA, /SA to the ground voltage level. Output control circuit 47 includes an inverter G10 receiving output enable signal OUTE, and N channel MOS transistors Q17, Q18 rendered conductive, when an output signal of inverter G10 is high, to fix amplifier internal nodes SA, /SA to the ground voltage level. If clocked gate circuit 44 operates in synchronization with clock signals CLK, /CLK, output signals DO, /DO of clocked gate circuit 44 are both fixed to the signals of the power supply voltage Vdd level.

Buffer circuit 40 further includes a control circuit 50 generating an internal control clock signal. Control circuit 50 includes an inverter 50a receiving clock signal CLK, a delay element 50b for delaying an output signal of inverter 50a by a prescribed period, an inverter circuit 50c for delaying an output signal of delay element 50b to generate delayed clock signal CLKD, an OR circuit 50e receiving delayed clock signal CLKD and detection period defining signal DETECT, a composite gate circuit 50f receiving complemental clock signal /CLK, an output signal of OR circuit 50e and output enable signal OUTE to generate sense activation signal /SAE, an inverter circuit G11 inverting sense activation signal /SAE to generate sense activation signal SAE, an NAND circuit 50g receiving detection period defining signal DETECT, an NOR circuit 50h receiving delayed clock signal CLKD and an output signal of NAND circuit 50g to generate transfer enable signal TGE, and an inverter circuit 50d receiving complemental clock signal /CLK to generate local clock signal CLKL.

Figure 24:
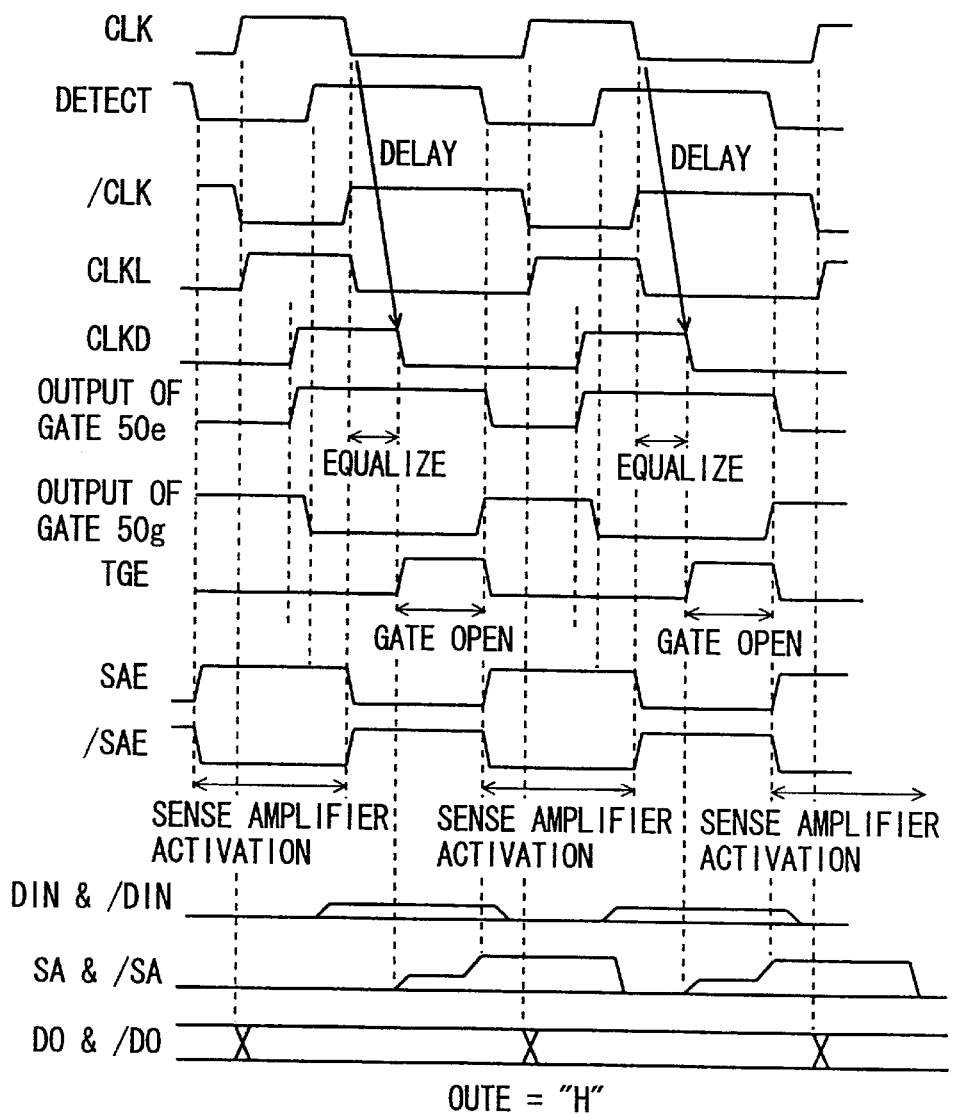
FIG. 24 is a signal waveform diagram representing an operation of the buffer circuit shown in FIG. 23.

Composite gate circuit 50f includes, equivalently in function, an AND circuit receiving complemental clock signal /CLK and the output signal of OR circuit 50a, an inverter inverting output enable signal OUTE, and an OR circuit receiving outputs of the inverter and the AND circuit. In the following, an operation of buffer circuit 40 shown in FIG. 23 will be described with reference to a timing chart shown in FIG. 24.

When output enable signal OUTE is low, amplifier internal nodes SA, /SA are fixed to the ground voltage level by MOS transistors Q17, Q18 in output control circuit 47. At this time, transfer enable signal TGE is low, and MOS transistors Q3, Q4 of transfer gate circuit 41 remain to be nonconductive. Therefore, even if clock signal CLK is applied when output enable signal OUTE is inactive, the operation of clocked gate circuit 44 is stopped and data signal generation is stopped, amplifier internal nodes Sa, /SA are fixed to the ground voltage level, thereby preventing internal nodes of the amplifier from entering a floating state.

During the data transfer operation, output enable signal OUTE is set to the high level. In the case of a semiconductor memory device, for example, when a read command designating data reading is applied, output enable signal OUTE is activated in response to the read command. During the data transfer operation, detection period defining signal DETECT is activated in synchronization with clock signal CLK similarly to the already above described embodiments. OR circuit 50e maintains the output signal thereof at the low level only when delayed clock signal CLKD and detection period defining signal DETECT are both low. Since output enable signal OUTE is high, composite gate circuit 50f operates as an AND circuit receiving complemental clock signal /CLK and the output signal of OR circuit 50e. Therefore, sense activation signal /SAE from composite gate 50f is driven to the inactive state or the high level in synchronization with a rise of complementary clock signal /CLK and activated in response to inactivation of detection period defining signal DETECT. Furthermore, sense amplifier circuit 43 starts the sensing operation in response to inactivation of detection period defining signal DETECT and substantially completes the sensing operation before activation of clocked gate circuit 44 similarly to the above described sense amplifier circuit shown in FIG. 20. Therefore, data can be transferred at high speed.

In output control circuit 47, output enable signal OUTE is high and MOS transistors Q17, Q18 remain non-conductive.

Equalize circuit 42 is activated to equalize amplifier internal nodes SA, /SA to the ground voltage level when complementary clock signal /CLK and delayed clock signal CLKD are both high.

NAND circuit 50g operates as an inverter and inverts detection period defining signal DETECT when output enable signal OUTE is high, and activates transfer enable signal TGE trough NOR circuit 50h when delayed clock signal CLKD is low and detection period defining signal DETECT is high. In transfer gate circuit 41, MOS transistor Q1, Q2 turn on when complementary clock signal /CLK is high, and MOS transistors Q3, Q4 turn on when transfer enable signal TGE is high. Therefore, transfer gate circuit 41 is rendered conductive after the equalize operation of equalize circuit 42 is completed according to delayed clock signal CLKD, thereby transmitting internal data signals DIN, DIN to internal nodes SA, /SA. When transfer gate circuit 41 is rendered non-conductive according to detection period defining signal DETECT, sense amplifier circuit 43 is activated in response to detection period defining signal DETECT, and sense amplifier circuit 43 is activated in response when transfer gate circuit 41 is rendered non-conductive. Thereafter, the data transfer operation is repeated in each clock cycle of clock signal CLK while output enable signal OUTE is high.

In the case of the arrangement shown in FIG. 23, in control circuit 50, NOR circuit 50h formed of four transistor elements is required for two MOS transistors (Q3 and Q4) in the transfer gate circuit in order to control the transfer gate circuit. The operation control of equalize circuit 42 requires two additional transistors in the equalize circuit. Since the control signals can be generated based on clock signal CLK, additional logic gates for generating the control signals are not necessary, and the control logic can be simplified. Further, the number of circuit elements can be reduced. Even in the arrangement for controlling sense amplifier circuit 43, complementary control signals are generated, provision of circuits for separately driving P and N MOS sensing units is not necessary, and thus the circuit arrangement is simplified.

Figure 25:
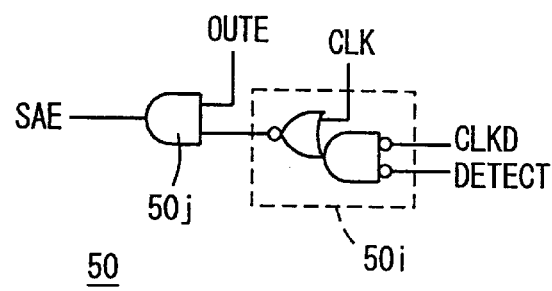
FIG. 25 shows a modification of the control circuit of the buffer circuit shown in FIG. 23.

FIG. 25 shows a modification of the arrangement of a sense amplifier control unit of control circuit 50. In FIG. 25, the sense amplifier control unit includes NOR/NOR composite gate 50i receiving clock signal CLK, delayed clock signal CLKD and detection period defining signal DETECT, and an AND circuit 50j receiving an output signal of NOR/NOR composite gate 50i and output enable signal OUTE to generate sense activation signal SAE. NOR/NOR composite gate 50i is functionally equivalent to the arrangement including a first NOR gate receiving delayed clock signal CLKD and detection period defining signal DETECT and a second NOR gate receiving clock signal CLK and an output signal of the first NOR gate.

In the arrangement shown in FIG. 25, sense activation signal /SAE is generated by inverting sense activation signal SAE. AND circuit 50j operates as a buffer circuit when output enable signal OUTE goes high and designates a data transfer mode. Therefore, the the sense control circuit shown in FIG. 25 is equivalently the same in arrangement as composite gate 25bb shown in FIG. 18 and can activate the sense amplifier at similar timing.

As described above, according to the fourth embodiment, the components in the buffer circuit are formed such that their operations are controlled by a plurality of control signals, and thus the equalize, transfer and amplification operations can be controlled correctly based on clock signal CLK with a simple circuit configuration. Furthermore, the number of transistors in a portion for generating the control signals can be reduced and the circuit area can be reduced.

Fifth Embodiment

Figure 26:
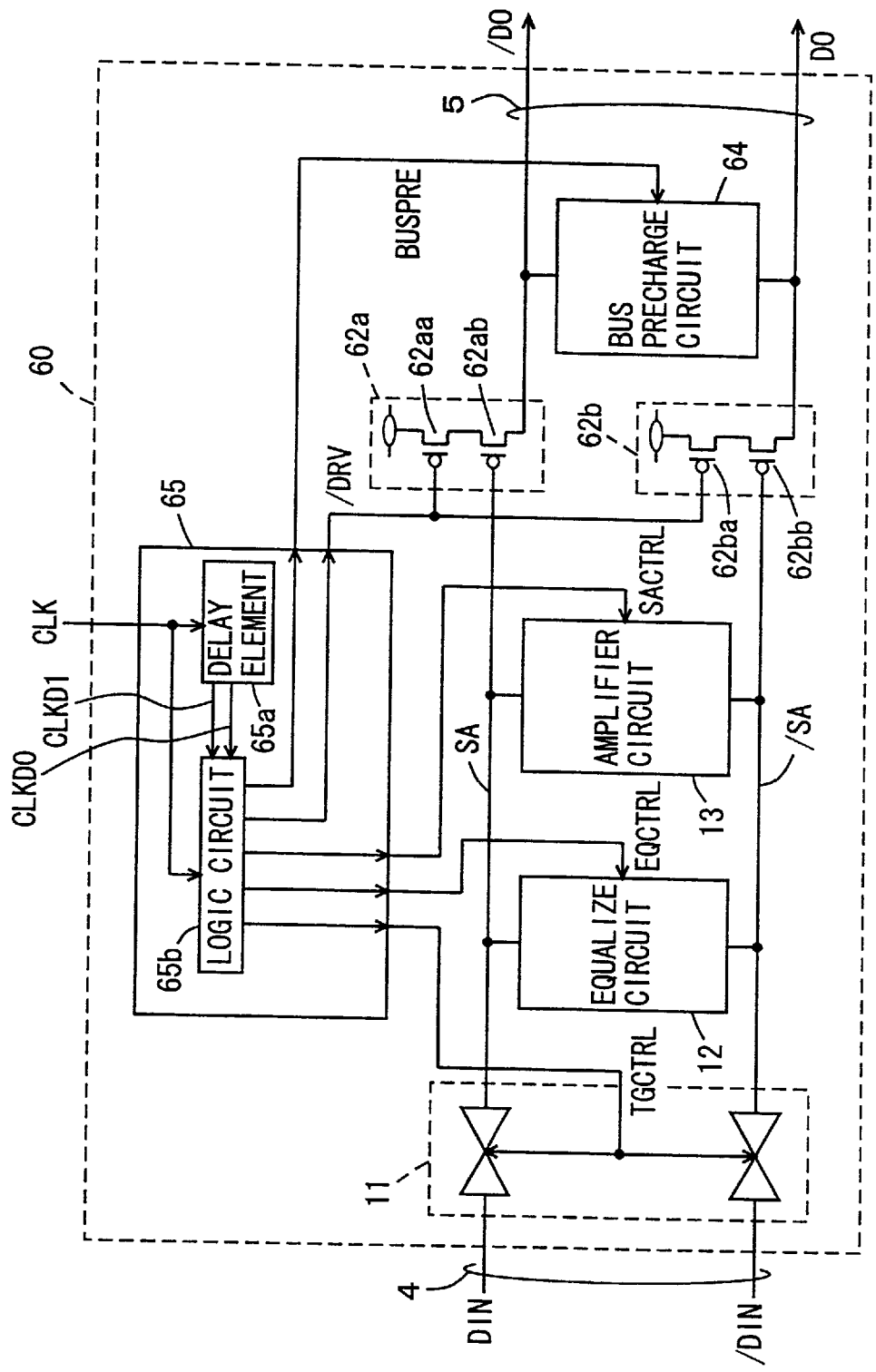
FIG. 26 shows an arrangement of a buffer circuit according to a fifth embodiment of the present invention.

FIG. 26 schematically shows an overall arrangement of a buffer circuit according to a fifth embodiment of the present invention. In FIG. 26, a buffer circuit 60 includes transfer gate circuit 11 for coupling a pair of first internal data lines 4 to amplifier internal nodes SA, /SA according to transfer control signal TGCTRL, equalize circuit 12 for equalizing amplifier internal nodes Sa, /SA to the ground voltage level according to equalize control signal EQCTRL, and an amplifier circuit 13 for differentially amplifying and latching the potentials on amplifier internal nodes SA, /SA according to amplifier control signal SACTRL. The arrangement of transfer gate circuit 11, equalize circuit 12 and amplifier circuit 13 is the same as in the first embodiment.

Buffer circuit 60 further includes an output drive circuit 62a activated in response to an output drive control signal /DRV and outputting, when activated, transfer data signal /DO onto a corresponding second internal data line according to the signal potential on amplifier internal node SA, a drive circuit 62b activated when output drive control signal /DRV is activated to drive the second internal data lines and for outputting transfer data signal DO according to the signal on amplifier internal node /SA, a bus precharge circuit 64 for precharging the pair of second internal data lines 5 to the ground voltage level according to a bus precharge designation signal BUSPRE, and a control circuit 65 for generating various control signals according to clock signal CLK.

Output drive circuit 62a includes a P channel MOS transistor 62aa rendered conductive to transmit the power supply voltage when output drive control signal /DRV is activated, and a P channel MOS transistor 62ab connected between MOS transistor 62aa and the second internal data line and having its gate connected to amplifier internal node SA. Output drive circuit 62b includes a P channel MOS transistor 62ab rendered conductive to transmit the power supply voltage when output drive control signal /DRV is activated, and a P channel MOS transistor 62bb connected between MOS transistor 62ba and the second internal data line and having its gate connected to amplifier internal node /SA. Bus precharge circuit 64 has a similar arrangement to that of equalize circuit 12.

Figure 27:
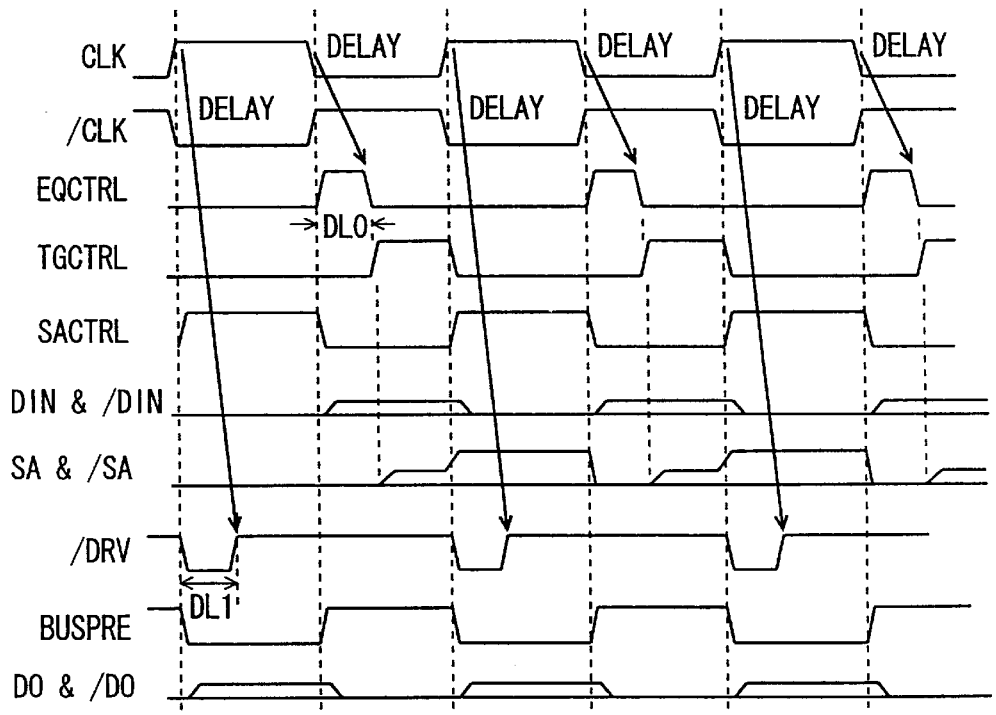
FIG. 27 is a timing chart representing an operation of the buffer circuit shown in FIG. 26.

Control circuit 65 includes a delay element 65a for delaying clock signal CLK to generating delayed clock signals CLKD0, CLKD1 having delay time DO0, DO1, and a logic circuit 65b for generating the control signals according to delayed clock signals CLKD0, CLKD1 from delay element 65a and clock signal CLK. In the following, an operation of buffer circuit 60 shown in FIG. 26 will be described with reference to a timing chart shown in FIG. 27.

When bus precharge designation signal BUSPRE attains the low level or the inactive state in response to a rise of clock signal CLK, bus precharge circuit 64 completes its precharging operation on the pair of data lines 5. In synchronization with a rise of clock signal CLK, output drive control signal /DRV is maintained at the low level or the active state in delay time DL1 of delayed clock signal CLKD1. In response, output drive circuits 62a, 62b are activated to produce transfer data signals /DO, DO according to the potentials on amplifier internal nodes SA, /SA. When amplifier internal nodes SA, /SA are both at the ground voltage level, output drive circuits 62a, 62b both output high level signals. The period during which output drive control signal /DRV is active is determined by delay time DL1 of delayed clock signal CLKD1, and the amplitudes of transfer data signals DO, /DO are reduced by shortening the time period for driving the pair of second internal data lines 5.

When clock signal CLK falls to the low level, equalize control signal EQCTRL becomes the high level or the active state for delay time DL0 of delayed clock signal CLKD0, and equalize circuit 12 equalizes amplifier internal nodes SA, /SA to the ground voltage level in response. When the equalize operation of equalize circuit 12 is completed, transfer control signal TGCTRL is activated, transfer gate circuit 11 is rendered conductive, and the pair of first data lines 4 is coupled to amplifier internal nodes SA, /SA. Then, amplifier control signal SACTRL is activated in synchronization with a rise of clock signal CLK, and amplifier circuit 13 differentially amplifies data transmitted through transfer gate circuit 11. Concurrently with the amplification operation of amplifier circuit 13, output drive control signal /DRV is activated, and transfer data signals /DO, DO are generated by output drive circuits 62a, 62b according to the signals on amplifier internal nodes SA, /SA. When clock signal CLK falls to the low level thereafter, bus precharge signal BUSPRE is activated, and bus precharge circuit 64 precharges the pair of second data lines 5 to the ground voltage level and waits for the next data transfer. These operations are repeated in synchronization with clock signal CLK in the transfer operation mode.

Figure 1:
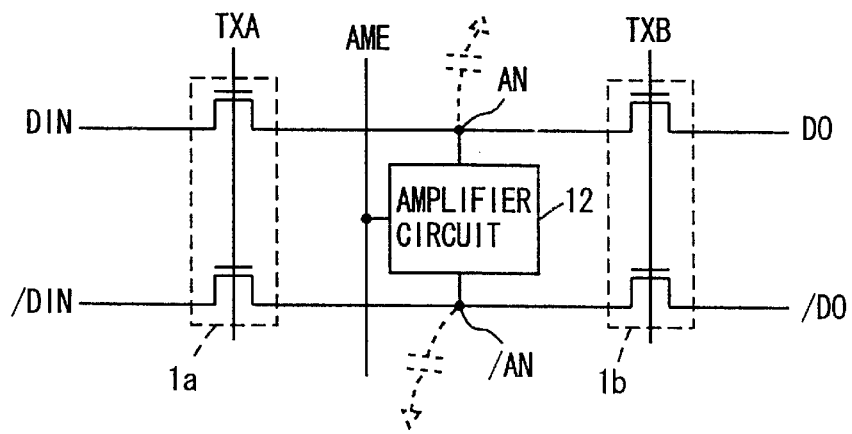
FIG. 1 shows an arrangement of a conventional transfer buffer circuit.
Figure 2:
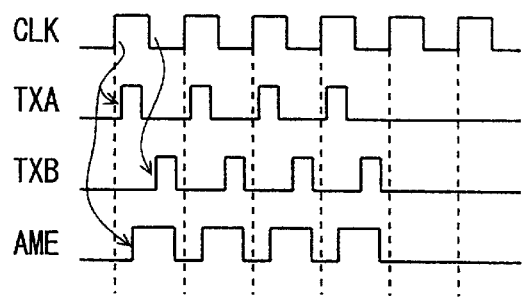
FIG. 2 is a timing chart representing an operation of the transfer buffer circuit shown in FIG. 1.
Figure 3A:
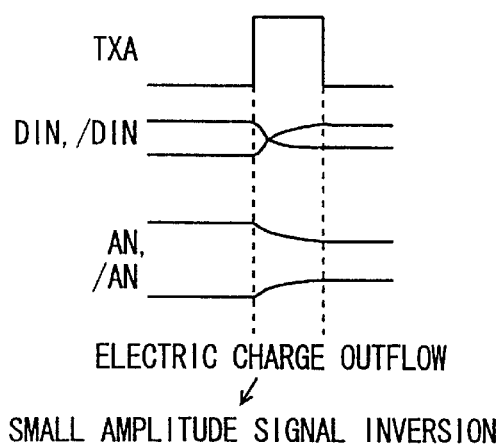
FIGS. 3A and 3B are charts for illustrating a problem in the conventional transfer buffer circuit.
Figure 3B:
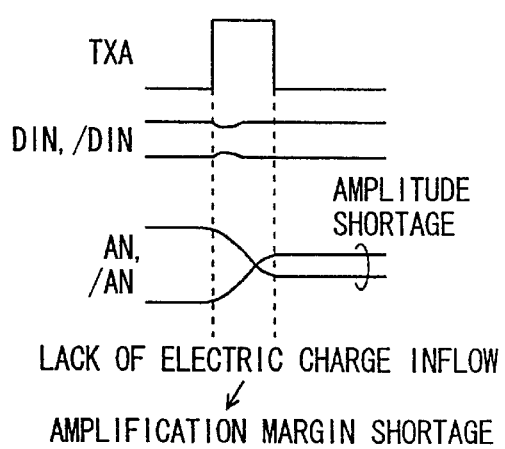

By precharging transfer data signals DO, /DO to the round voltage level using bus precharge circuit 64, the small amplitude data signals can be transmitted to a circuit at the next stage without destroying the signals (if the bus precharging operation is not performed, similar problems as described in FIGS. 3A and 3B are caused).

Buffer circuit 60 transmits the data signal for only a half cycle of clock signal CLK. Since the small amplitude signals are transmitted, signal transmission at high speed can be made possible, and also power consumption can be reduced.

Figure 28:
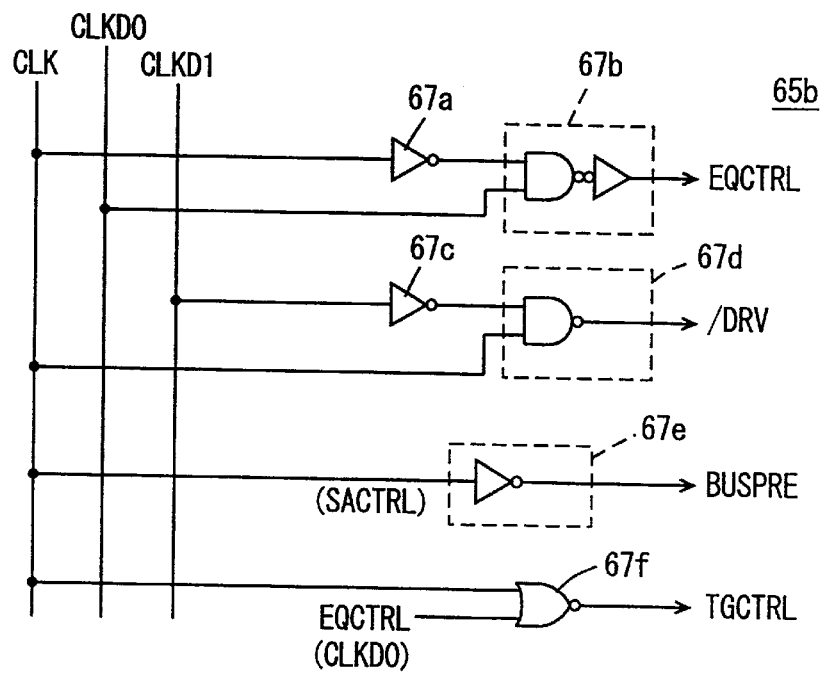
FIG. 28 shows one example of the arrangement of the logic circuit shown in FIG. 26.

FIG. 28 shows one example of the arrangement of logic circuit 65b shown in FIG. 26. In FIG. 28, logic circuit 65b includes an inverter circuit 67a receiving clock signal CLK, an AND circuit 67b receiving an output signal of inverter circuit 67a and delayed clock signal CLKD0 to generate equalize control signal EQCTRL, an inverter circuit 67c receiving delayed clock signal CLKD1, an NAND circuit 67d receiving an output signal of inverter circuit 67c and clock signal CLK to generate output drive control signal /DRV, an inverter buffer circuit 67e for buffering clock signal CLK to generate bus precharge designation signal BUSPRE, and an NOR circuit 67f receiving clock signal CLK and equalize control signal EQCTRL (or delayed clock signal CLKD to generate transfer control signal TGCTRL.

When clock signal CLK falls, equalize control signal EQCTRL attains the high level for the delay time corresponding to the delay of delayed clock signal CLKD0 with respect to clock signal CLK.

When clock signal CLK rises to the high level, output drive control signal /DRV attains the low level for the delay time corresponding to the delay of delayed clock signal CLKD1 with respect to clock signal CLK. When clock signal CLK falls to the low level, bus precharge designation signal BUSPRE is activated. When equalize control signal EQCTRL goes low, clock signal CLK is low and thus transfer control signal TGCTRL is driven to the active state in response to the completion of equalization. Instead of equalize control signal EQCTRL, delayed clock signal CLKD0 may be used to generate transfer control signal TGCTRL.

Furthermore, bus precharge designation signal BUSPRE may be generated from amplifier control signal SACTRL. Since amplifier circuit 13 is inactive when clock signal CLK is low, bus precharge signal BUSPRE is activated to precharge transfer data signals DO, /DO to the ground voltage level. Amplifier control signal SACTRL is generated by a generation unit, not shown, for buffering clock signal CLK.

Figure 29:
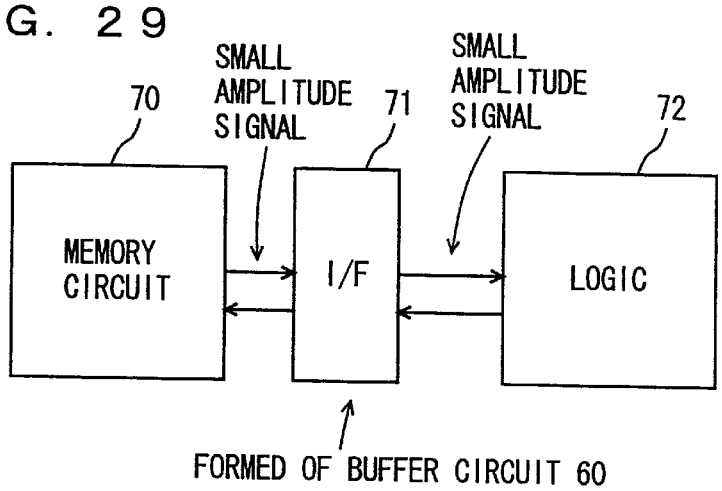
FIG. 29 shows one example of the application of the buffer circuit shown in FIG. 26.

FIG. 29 shows one example of the application of the buffer circuit according to the fifth embodiment. In FIG. 29, an interface circuit (I/F) 71 is provided between a memory circuit 70 and a logic 72. Interface circuit 71 includes buffer circuit 60 shown in FIG. 26 for each data bit. Memory circuit 70 includes a plurality of memory cells and outputs selected memory cell data in the form of small amplitude signals. Interface circuit 71 transmits the memory cell data read from memory circuit 70 to logic circuit 72 in synchronization with clock signal CLK. Therefore, interface circuit (I/F) 71 operates as a buffer for transferring the small amplitude signals between memory circuit 70 and logic 72. In a system LSI including memory circuit 70 and logic 72 provided integrately together on one chip, for example, memory cell data can be transferred at high speed and with low power consumption. By providing interface circuit (I/F) 71 as a bidirectional buffer circuit (providing a buffer circuit for each transfer direction) as shown in FIG. 29, the small amplitude signals can be bidirectionally transferred between memory circuit 70 and logic 72.

Figure 30:
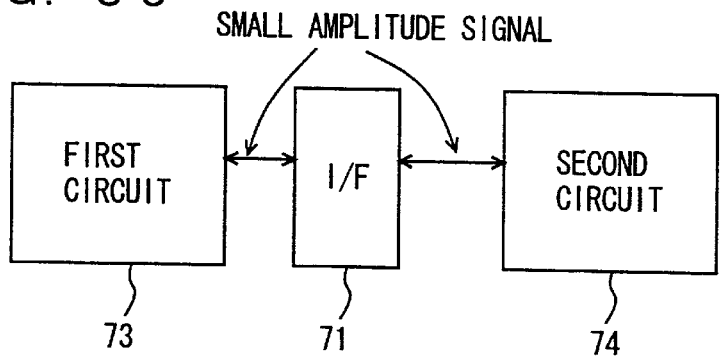
FIG. 30 shows another application of the buffer circuit shown in FIG. 26.

FIG. 30 shows another application of the buffer circuit according to the fifth embodiment of the present invention. In FIG. 30, interface circuit (I/F) 71 is provided between a first circuit 73 for inputting/outputting small amplitude signals and a second circuit 74 for inputting/outputting the small amplitude signals. Interface circuit (I/F) 71 is a bidirectional buffer. Therefore, even if first and second circuits 73, 74 input/output the small amplitude signals, the small amplitude signals can be transferred correctly at high speed in synchronization with the clock signal.

As described above, according to the fifth embodiment, the bus precharge circuit is provided and a pair of output signal lines are driven in the time determined by the delayed clock signal. Therefore, the period for driving the pair of output signal lines can be determined by the delay time of the delayed clock signal and, according to the CMOS level signals amplified by the amplifier circuit, the small amplitude signals can be transferred correctly onto the pair of output signal lines in synchronization with the clock signal.

Sixth Embodiment

FIG. 31 shows an arrangement of a buffer circuit according to a sixth embodiment of the present invention. The buffer circuit shown in FIG. 31 is different from the buffer circuit according to the third embodiment shown in FIG. 18 in the points as described below. In the buffer circuit according to the sixth embodiment, control circuit 25 further includes a delay element 25be receiving delayed clock signal CLKD0 from delay element 25a, and delayed clock signal CLKD1 from delay element 25be is used instead of detection period defining signal DETECT. Since other parts are the same as in FIG. 18, the corresponding parts are denoted by the same reference characters and their description will not be repeated.

Figure 32:
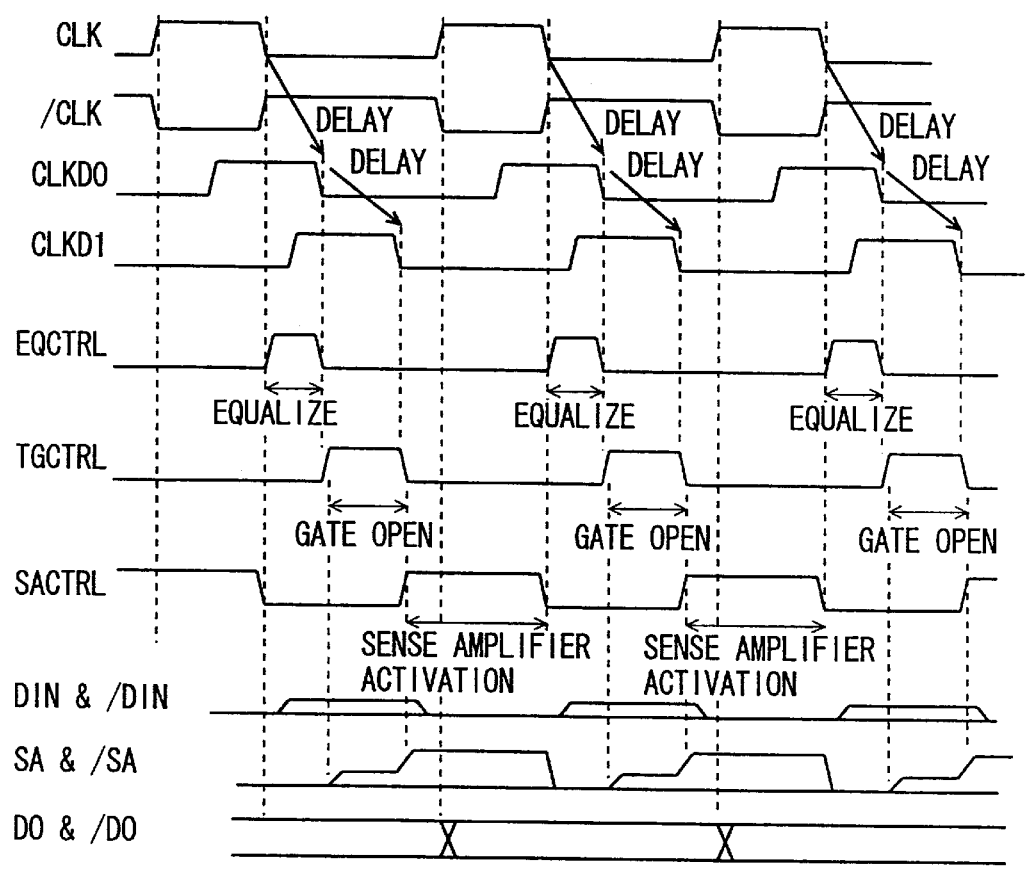
FIG. 32 is a timing chart representing an operation of the buffer circuit shown in FIG. 31.

In the following, an operation of the buffer circuit shown in FIG. 31 will be described with reference to a timing chart shown in FIG. 32.

In the data read or data transfer operation, when clock signal CLK falls to the low level, equalize control signal EQCTRL rises to the high level. According to equalize control signal EQCTRL, equalize circuit 12 equalizes amplifier internal nodes SA, /SA to the ground voltage level. When the delay time of delay element 25a then elapses, delayed clock signal CLKD0 falls to the low level, equalize control signal EQCTRL goes low, equalize circuit 12 is inactivated, and the equalize operation of equalize circuit 12 is completed.

When delayed clock signal CLKD1 falls to the low level, clock signal CLK is already low, and thus transfer control signal TGCTRL from gate circuit 25bc goes high, transfer gate circuit 11 is rendered conductive, and data signals DIN, /DIN are transmitted to amplifier internal nodes SA, /SA.

After the elapse of the delay time of delay element 25be, delayed clock signal CLKD1 goes low, transfer control signal TGCTRL goes low in response, and transfer gate circuit 11 is rendered non-conductive. When delayed clock signal CLKD1 goes low, delayed clock signal CLKD0 is already low, thus sense activation signal /SAE (sense control signal /SACTRL) is activated in response to the next rise of clock signal CLK, and amplifier circuit 13 differentially amplifies the signal potentials on amplifier internal nodes SA, /SA. In FIG. 32, the signal waveform of sense control signal SACTRL is shown. Sense activation signal /SAE is an inverted signal of sense control signal SACTRL. When amplifier control signal SACTRL is activated, clocked gate circuit 14 is activated in synchronization with clock signal CLK to buffer the signal potentials on amplifier internal nodes SA, /SA to generate transfer data signals DO, /DO. When clock signal CLK goes low thereafter, sense activation signal /SAE from composite gate circuit 25bb is inactivated (amplifier control signal SACTRL is driven to the low level).

When clock signal CLK falls to the low level, clocked gate circuit 14 enters the output high impedance state, equalize control signal EQCTRL is activated, and equalize circuit 12 drives amplifier internal node SA, /SA to the ground voltage level. Thereafter, these operations are repeated in each clock cycle as long as transfer data exists.

In the case of the buffer circuit shown in FIG. 31, there is no need to use both of detection period defining signal DETECT and clock signal CLK, and various control signals are merely generated from clock signal CLK. It is therefore not necessary to take into account the skew between clock signal CLK and detection period defining signal DETECT and to account for timing margin. The equalize, amplification and transfer operations can be performed correctly. Further, generation detection period defining signal DETECT is unnecessary, and the arrangement of the entire control unit of a semiconductor device which includes the buffer circuit is simplified.

Furthermore, amplifier circuit 13 is activated in response to a rise of delayed clock signal CLKD1 to differentially amplify the potentials on amplifier internal nodes SA, /SA, and clocked gate circuit 14 is activated in response to a rise of clock signal CLK. Therefore, the signal potentials on amplifier internal nodes SA, /SA are already sufficiently amplified when clocked gate circuit 14 is activated, and thus data signals /DO, DO can be generated and transferred at high speed to a circuit at the next stage.

Other Applications

In the above description, the activate levels of the various control signals and the clock signals may be reversed in logic levels.

As described above, according to the present invention, the internal nodes of the transfer circuit are precharged to the ground voltage level, and then the transfer data signals are received, amplified and transferred to a circuit at the next stage. Even if small amplitude signals are to be transferred, they can be correctly amplified and transferred at high speed to a circuit at the next stage without disadvantageous effects on input signals.

Since the control signals for circuit internal operations are generated based on the basic clock signal, the arrangement of the control unit can be simplified and a buffer circuit with a small occupying area can be implemented.

Since the control circuit is provided for each buffer circuit, timing skew does not have to be taken into account and a high speed transfer operation can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A transfer buffer circuit, comprising:
   an equalize circuit for equalizing, when activated, an internal node pair to a prescribed potential;
   a transfer gate circuit activated after said equalize circuit completes equalization operation, for coupling a first signal line pair and said internal node pair;
   an amplifier circuit activated after said transfer gate circuit completes transfer operation, for differentially amplifying signals on said internal node pair;
   an output transfer circuit activated after said transfer gate circuit completes the transfer operation, for driving a second signal line pair according to the signals on said internal node pair; and
   a control circuit for controlling operations of said equalize circuit, said transfer gate circuit, said amplifier circuit and said output transfer circuit according to at least a clock signal.

2. The transfer buffer circuit according to claim 1, wherein said equalize circuit includes a transistor element for equalizing said internal node pair to a ground potential.

3. The transfer buffer circuit according to claim 1, wherein said first signal line pair is provided in plurality in parallel, said transfer buffer circuit is provided corresponding to the first signal line pairs provided in plurality, and said clock signal is applied commonly to the transfer buffer circuits provided in plurality, to define a signal transfer cycle.

4. The transfer buffer circuit according to claim 1 wherein said control circuit includes
an equalize control circuit for activating said equalize circuit for a prescribed period in response to a change of said clock signal from a first level to a second level,
a transfer control circuit receiving said clock signal and rendering said transfer gate circuit conductive after an elapse of said prescribed period and for rendering said transfer gate circuit non-conductive in response to a change of said clock signal from said second level to said first level, and
an amplifier control circuit for activating said amplifier circuit in response to a change of said clock signal from said second level to said first level, and
said output transfer circuit includes a clocked gate circuit activated when said clock signal is at said first level for driving said second signal line pair according to the signals on said internal node pair.

5. The transfer buffer circuit according to claim 4, wherein said amplifier control circuit includes means for inactivating said amplifier circuit in response to a change of said clock signal from said first level to said second level.

6. The transfer buffer circuit according to claim 1, wherein said control circuit includes means for activating, in signal transfer operation, said amplifier circuit before activation of said output transfer circuit according to a detection period defining signal and said clock signal, said detection period defining signal changing in an identical cycle with and out of phase with said clock signal.

7. The transfer buffer circuit according to claim 1, wherein said control circuit receives said clock signal and a detection period defining signal generated in signal transfer operation, activated when said clock signal changes from a second level to a first level and inactivated when said clock signal changes from said second level to said first level, and
said control circuit includes
an equalize control circuit for activating said equalize circuit for a prescribed period in response to a change of said clock signal from said first level to said second level,
a transfer control circuit for rendering said transfer gate circuit nonconductive in response to inactivation of said detection period defining signal after an elapse of said prescribed period, and
an amplifier control circuit for activating said amplifier circuit in response to inactivation of said detection period defining signal and inactivating said amplifier circuit in response to a change of said clock signal from said first level to said second level, and
said output transfer circuit includes a clocked gate circuit activated when said clock signal is at said first level, for driving said second signal line pair according the signals on said internal node pair.

8. The transfer buffer circuit according to claim 1, wherein said control circuit includes
a delay element for delaying said clock signal by a prescribed period to generate a delayed clock signal,
an inversion circuit for inverting said clock signal to generate an inverted clock signal,
an equalize control gate for activating said equalize circuit in response to said delayed clock signal and said inverted clock signal,
a transfer control gate for rendering said transfer gate circuit conductive in response to said clock signal, said delayed clock signal and a detection period defining signal, said detection period defining signal being generated changing in an identical cycle with and out of phase with said clock signal in a signal transfer operation mode, and
an amplifier control gate responsive to said clock signal and said detection period defining signal for activating said amplifier circuit when said transfer gate circuit is inactivated.

9. The transfer buffer circuit according to claim 1, wherein said control circuit includes means for applying a plurality of control signals for said transfer gate circuit, said equalize circuit and said amplifier circuit according to said clock signal and a detection period defining signal, and said detection period defining signal is generated changing in an identical cycle with and out of phase with said clock signal in a signal transfer operation mode.

10. The transfer buffer circuit according to claim 1, wherein said control circuit includes
a first equalize control gate for generating a first equalize control signal in response to said clock signal and a detection period defining signal,
a second equalize control gate for generating a second equalize control signal activated for a prescribed period in response to said clock signal,
a first transfer control gate for generating a first transfer control signal according to said detection period defining signal,
a second transfer control gate for generating a second transfer control signal according to said first equalize control signal and said clock signal,
a first amplifier control gate for generating a first amplifier control signal according to said detection period defining signal, and
a second amplifier control gate for generating a second control signal for activating said amplifier circuit according to said clock signal,
said transfer gate circuit includes first and second transfer gates connected in series between said first signal line pair and said internal node pair, said first transfer gate is selectively rendered conductive in response to said first transfer control signal, and said second transfer gate is selectively rendered conductive according to said second transfer control signal,
said equalize circuit includes equalizing transistors connected between an internal node of said internal node pair and a ground node and rendered conductive in response to the first and second equalize control signals, respectively, and
said amplifier circuit includes a sense amplifier for differentially amplifying the signals on said internal node pair when activated, and an amplifier activation transistor activating said sense amplifier when at least one of the first and second amplifier control signals is activated.

11. The transfer buffer circuit according to claim 1, further comprising;
an output control circuit for precharging said internal node pair to said prescribed potential when an output enable signal for enabling signal transfer operation is inactivated.

12. The transfer buffer circuit according to claim 9, wherein said control circuit includes
- a delay gate for delaying said clock signal to generate a delayed clock signal,
- an inversion gate for inverting said clock signal to generate an inverted clock signal,
- an amplifier control gate for generating a complementary amplifier activation signals according to said detection period defining signal, said delayed clock signal and an output enable signal for enabling signal transfer operation, and
- a transfer control gate for generating a transfer control signal according to said detection period defining signal, said output enable signal and said delayed clock signal,
- said transfer gate circuit includes first and second transfer gates rendered conductive in response to said inverted clock signal and said transfer control signal, respectively, and said first and second transfer gates are connected in series between a first signal line of said first signal line pair and an internal node of said internal node pair,
- said equalize circuit includes first and second transistor elements receiving said inverted clock signal and said delayed clock signal, respectively, at their gates, and said first and second transistor elements are connected in series between the internal node of said internal node pair and a ground node, and
- said amplifier circuit includes a sense amplifier for differentially amplifying signals on said internal node pair, and an amplifier activation transistor pair for activating said sense amplifier in response to said complementary amplifier activation signals.

13. The transfer buffer circuit according to claim 1, wherein said output transfer circuit includes an output drive circuit pair, provided for said internal node pair for driving the second signal line of said second signal line pair to a first potential in response to the signals on the internal node pair when made active, and
- said control circuit includes a drive control circuit for activating said output drive circuit pair for a predetermined period in response to said clock signal.

14. The transfer buffer circuit according to claim 13, wherein each output drive circuit of said output drive circuit pair includes a pair of first and second transistor pairs connected in series between a power supply node applying a first voltage different from said prescribed potential and a corresponding second signal line of said second signal line pair, the first transistor receives said output drive control signal at a gate thereof, and the second transistor has a gate connected to a corresponding internal node of said internal node pair.

15. The transfer buffer circuit according to claim 13, further comprising:
- a bus precharge circuit for precharging said second signal line pair to said prescribed potential.

16. The transfer buffer circuit according to claim 15, wherein said control circuit includes
- a delay circuit for delaying said clock signal by first and second time periods to generate first and second delayed clock signals,
- an equalize control gate for controlling said equalize circuit in response to said clock signal and the first delayed clock signal, an output drive control gate for generating a drive control signal for activating said output drive circuit in response to the clock signal and said second delayed clock signal,
- a bus precharge gate for activating said bus precharge circuit when said amplifier circuit is inactivated, in response to said clock signal, and
- a transfer control gate for activating said transfer gate circuit when said equalize control signal is inactivated, in response to said clock signal.

17. The transfer buffer circuit according to claim 1, wherein said control circuit includes
- a delay gate for delaying said clock signal by first and second time periods to generate first and second delayed clock signals,
- an inversion gate for inverting said clock signal to generate an inverted clock signal,
- an equalize control gate for activating said equalize circuit according to said inverted clock signal and the first delayed clock signal,
- a transfer control gate for activating said transfer gate circuit in synchronization with inactivation of said equalize circuit in response to said first delayed clock signal, the second delayed clock signal and said clock signal, and
- an amplifier control gate for activating said amplifier circuit when said transfer gate circuit is non-conductive, in response to said clock signal, said first delayed clock signal and said second delayed clock signal, and
- said output transfer circuit is activated after activation of said amplifier circuit in response to said clock signal and said inverted clock signal.

18. The transfer buffer circuit according to claim 1, wherein said first signal line pair receives small amplitude signals having smaller amplitudes than a power supply voltage.

19. The transfer buffer circuit according to claim 1, wherein internal read data read from a memory cell is transmitted onto said first signal line pair.

20. The transfer buffer circuit according to claim 1, wherein small amplitude signals having amplitudes smaller than a power supply voltage are output onto said second signal line pair by said output transfer circuit.

* * * * *